United States Patent
Fukasawa

(10) Patent No.: US 7,586,185 B2
(45) Date of Patent: Sep. 8, 2009

(54) SEMICONDUCTOR DEVICE HAVING A FUNCTIONAL SURFACE

(75) Inventor: Norio Fukasawa, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 225 days.

(21) Appl. No.: 11/209,791

(22) Filed: Aug. 24, 2005

(65) Prior Publication Data

US 2006/0214294 A1 Sep. 28, 2006

(30) Foreign Application Priority Data

Mar. 28, 2005 (JP) .............................. 2005-093001

(51) Int. Cl.
*H01L 24/44* (2006.01)

(52) U.S. Cl. .............................. 257/688; 257/E23.011; 257/679; 257/687; 257/693; 257/680

(58) Field of Classification Search ................ 257/688, 257/679, 687, 693, 737, 738, 787, 680, E23.011
See application file for complete search history.

(56) References Cited

U.S. PATENT DOCUMENTS

| | | | | |
|---|---|---|---|---|
| 5,319,242 | A * | 6/1994 | Carney et al. ................ | 257/680 |
| 5,682,062 | A * | 10/1997 | Gaul ............................ | 257/686 |
| 6,049,124 | A * | 4/2000 | Raiser et al. ................. | 257/712 |
| 6,608,371 | B2 * | 8/2003 | Kurashima et al. ........... | 257/686 |
| 6,620,731 | B1 * | 9/2003 | Farnworth et al. ........... | 438/667 |
| 6,670,221 | B2 * | 12/2003 | Sakoda et al. ................ | 438/112 |
| 6,765,299 | B2 * | 7/2004 | Takahashi et al. ............ | 257/777 |
| 6,919,628 | B2 * | 7/2005 | Lee et al. ..................... | 257/686 |
| 6,962,865 | B2 * | 11/2005 | Hanaoka et al. .............. | 438/618 |
| 7,045,899 | B2 * | 5/2006 | Yamane et al. ............... | 257/777 |
| 7,091,124 | B2 * | 8/2006 | Rigg et al. ................... | 438/667 |
| 7,122,280 | B2 * | 10/2006 | Moriya et al. ................. | 430/5 |
| 7,230,318 | B2 * | 6/2007 | Kripesh et al. ............... | 257/621 |
| 2002/0013061 | A1 * | 1/2002 | Siniaguine et al. ........... | 438/706 |
| 2003/0062613 | A1 * | 4/2003 | Masumoto et al. ........... | 257/687 |
| 2008/0006900 | A1 * | 1/2008 | Chan et al. .................. | 257/499 |

FOREIGN PATENT DOCUMENTS

| | | |
|---|---|---|
| JP | 2002-150256 | 5/2002 |
| JP | 2003-235830 | 8/2003 |
| JP | 2004-319678 | 11/2004 |

* cited by examiner

*Primary Examiner*—Eugene Lee
(74) *Attorney, Agent, or Firm*—Westerman, Hattori, Daniels & Adrian, LLP.

(57) ABSTRACT

A semiconductor device for fingerprint sensors reduces a mounting area of the semiconductor device and improves a processing capacity of assembling and testing process. The semiconductor device has a functional surface that provides a predetermined function. A semiconductor element has a circuit formation surface on which a plurality of electrodes are formed and a back surface opposite to the circuit formation surface. A part of the circuit formation surface functions as the functional surface. Wiring is formed on the back surface of the semiconductor element. A plurality of connection parts extends between the circuit formation surface and the back surface of the semiconductor element so as to electrically connect the electrodes to the wiring. A plurality of external connection terminals are exposed outside the semiconductor device on a side of the back surface of the semiconductor element.

11 Claims, 22 Drawing Sheets

FIG.13
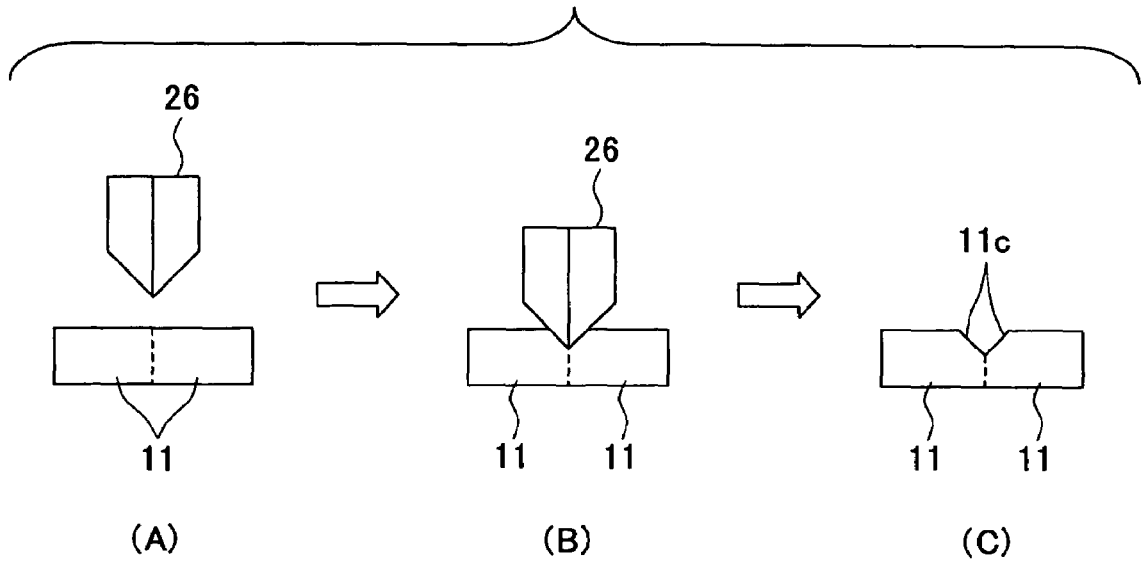
(A) (B) (C)
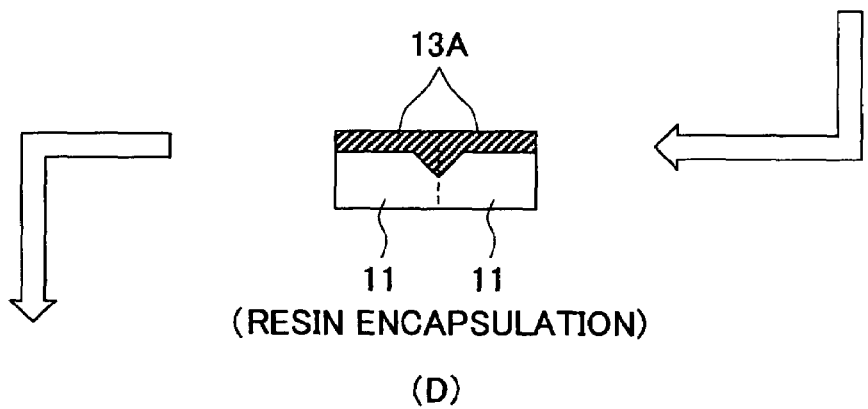
(RESIN ENCAPSULATION)
(D)
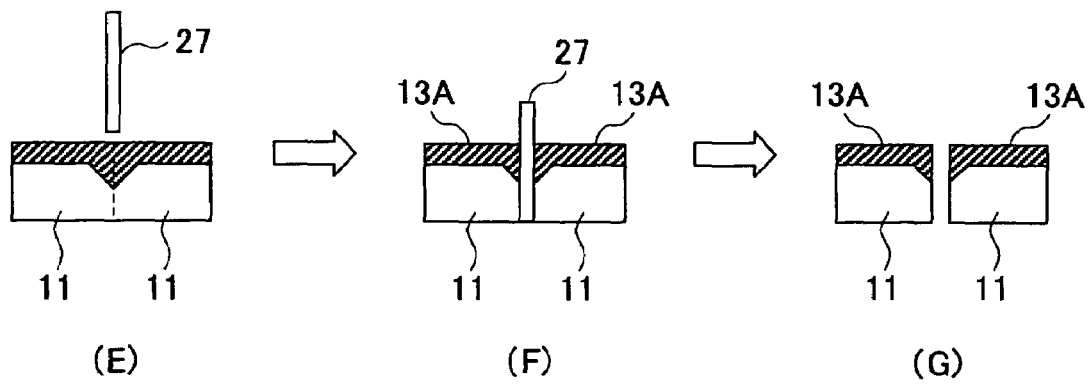
(E) (F) (G)

SEMICONDUCTOR DEVICE HAVING A FUNCTIONAL SURFACE

BACKGROUND OF THE INVENTION

1. Field of the Invention

The present invention generally relates to semiconductor devices and, more particularly, to a semiconductor device used for a small fingerprint sensor and a manufacturing method of such a semiconductor device.

2. Description of the Related Art

In recent years, a fingerprint sensor, which enables personal verification by a fingerprint, has become widely used. Since the fingerprint sensor is used for small electronic equipments such as a portable terminal or a portable phone, there is a demand for reducing a mounting area of a semiconductor device for fingerprint sensors. Moreover, in order to recognize a fingerprint by contacting a finger directly to a semiconductor device in the fingerprint sensor, high-reliability in packaging is required for the semiconductor device for fingerprint sensors. Further, since the fingerprint sensor is used for consumer electronic equipments such as a potable terminal or a portable phone in many cases, cost reduction is required for the semiconductor device for fingerprint sensors.

A conventional semiconductor device for fingerprint sensors is formed as a semiconductor device, similar to semiconductor devices currently used for other applications, by combining and packaging a semiconductor element and an interposer (a redistribution wiring layer or a redistribution wiring substrate). However, in such a conventional packaging, a mounting area of the semiconductor device is larger than the semiconductor element since an interposer is used. Moreover, since assembly is performed on an individual chip basis and a test is performed on an individual semiconductor device basis, it is difficult to reduce an assembling and manufacturing cost.

FIG. 1 is a cross-sectional view of a conventional semiconductor device for fingerprint sensors. A semiconductor element 1 is mounted on an interposer 2, and is electrically connected to the interposer 2 by wires 3 such as bonding wires. The semiconductor element 1 is packaged by being encapsulated by a seal resin 4 in a state where a part of a surface of the semiconductor element 1, which part serves as a sensor surface 1b, is exposed. The interposer 2 is a multilayer wiring substrate, and solder balls 5, as external connection terminals, are formed on a side opposite to the surface where the semiconductor element 1 is mounted.

As shown in FIG. 2, the packaged semiconductor device for fingerprint sensors is mounted to an internal board 7 in an equipment using the solder balls 5. The internal board 7 on which the semiconductor device for fingerprint sensors is mounted is incorporated into a housing 6 of the equipment in a state where the surface of the element, which serves as the sensor surface 1b, is exposed to outside from an interior of the equipment.

The above-mentioned conventional semiconductor device for fingerprint sensors is disclosed in Japanese Laid-Open Patent Applications No. 2002-150256 and No. 2004-319678.

In the above-mentioned conventional semiconductor device for fingerprint sensors, the interposer 2 is used, and, thus, a connection part (portion for applying wire bonding) is required between the semiconductor element 1 and the interposer 2. Therefore, the area of the semiconductor device for fingerprint sensors is larger than the semiconductor element 1 by an area corresponding to the connection part, which hinders a reduction in the mounting area.

In assembly of the semiconductor device for fingerprint sensors, a connection with the interposer 2 is carried out for each semiconductor element 1. Also in a test as a semiconductor device, the test is carried out for each semiconductor device. Therefore, in manufacturing of the semiconductor device for fingerprint sensors, the assembly and the test process are carried out on an individual semiconductor element 1 basis. That is, the same process is carried out for the number of semiconductor elements 1, which results in low processing efficiency.

With respect to the reliability of mounting, external connection terminals such as the solder balls 5 are connected to an internal board when mounting the semiconductor device to the internal board. Since the solder ball connection of the semiconductor device is made to flat terminals of the interposer 2, the mounting strength is determined by the size of the connection area. In order to enlarge the connection area for the purpose of improving the mounting strength, the terminal area of the interposer 2 may be enlarged. However, increasing the terminal area may results in further increasing the area of the interposer 2 rather than decreasing the area of the interposer 2. That is, increasing the terminal area of the interposer 2 increases the area of the semiconductor device for fingerprint sensors, which hinders reduction of the mounting area.

SUMMARY OF THE INVENTION

It is a general object of the present invention to provide an improved and useful semiconductor device in which the above-mentioned problems are eliminated.

A more specific object of the present invention is to provide a semiconductor device for fingerprint sensors and a manufacturing method of a semiconductor device for fingerprint sensors that reduces a mounting area of the semiconductor device and improves a processing capacity of assembling and testing process so as to reduce a manufacturing cost and also improves reliability of mounting.

In order to achieve the above-mentioned objects, there is provided according to one aspect of the present invention a semiconductor device having a functional surface that provides a predetermined function, the semiconductor device comprising: a semiconductor element having a circuit formation surface on which a plurality of electrodes are formed and a back surface opposite to the circuit formation surface, a part of the circuit formation surface functioning as the functional surface; wiring formed on the back surface of the semiconductor element; a plurality of connection parts extending between the circuit formation surface and the back surface of the semiconductor element so as to electrically connect the electrodes to the wiring; and a plurality of external connection terminals exposed outside the semiconductor device on a side of the back surface of the semiconductor element.

Additionally, there is provided according to another aspect of the present invention a semiconductor device manufacturing method of manufacturing a plurality of semiconductor devices, each having a circuit formation surface on which a plurality of electrodes are formed and a back surface opposite to the circuit formation surface, a part of the circuit formation surface functioning as the functional surface, the manufacturing method comprising: forming a plurality of connection parts by an electrically conductive material in each of the semiconductor elements formed in a substrate, the connection parts electrically connected to the respective electrodes and extending between the circuit formation surface and the back surface of each of the semiconductor elements; forming wiring connected to the connection parts on the back surface in each of the semiconductor elements; forming external connection terminals connected to the wiring in each of the semiconductor elements; resin-encapsulating the semiconductor elements in a state where the semiconductor elements are formed in the substrate so that the functional surface and the external connection terminals are exposed; applying a electrical test to each of the semiconductor device in a state where the semiconductor devices are formed in the substrate; and individualizing the semiconductor elements by cutting the substrate along boundaries between the semiconductor elements, thereby forming the plurality of semiconductor devices in a lump.

BRIEF DESCRIPTION OF THE DRAWINGS

FIG. 13 is an illustration showing a process of resin-encapsulating a side surface;

DETAILED DESCRIPTION OF THE PREFERRED EMBODIMENTS

A description will now be given, with reference to the drawings, of embodiments according to the present invention.

Figure 1:
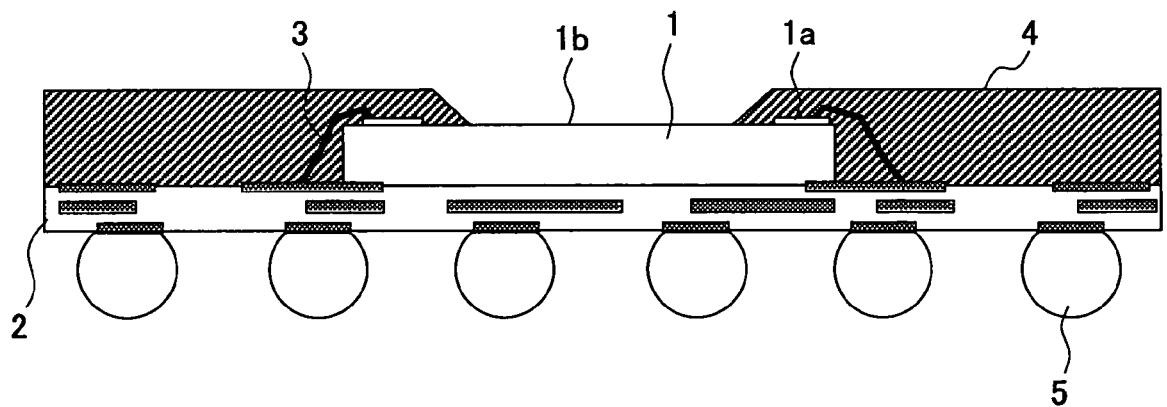
FIG. 1 is a cross-sectional view of a conventional semiconductor device for fingerprint sensors.
Figure 2:
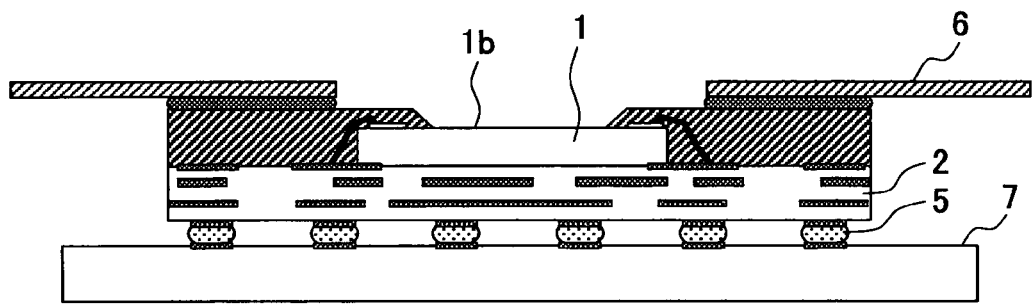
FIG. 2 is a cross sectional view showing a state where the semiconductor device for fingerprint sensors shown in FIG. 1 is incorporated into an equipment.
Figure 3:
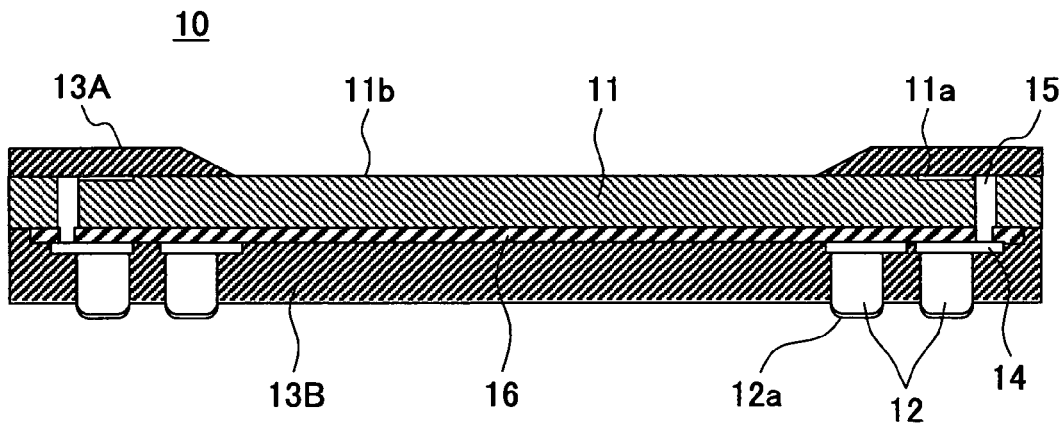
FIG. 3 is a cross-sectional view of a semiconductor device for fingerprint sensors according to a first embodiment of the present invention.

First, a description will be given, with reference to FIG. 3, of a semiconductor device for fingerprint sensors according to a first embodiment of the present invention. FIG. 3 is a cross-sectional view of the semiconductor device for fingerprint sensors according to the first embodiment of the present invention.

The semiconductor device 10 for fingerprint sensors shown in FIG. 3 comprises a semiconductor element 11 having electrodes 11a, external connection terminals 12 formed on the semiconductor element 11 on a side opposite to the electrodes 11a, a seal resin 13B provided on the side of the external connection terminals 12, and a seal resin 13A provided on the side of a sensor surface 11b. It should be noted that the sensor surface 11b serves as a functional surface that provides a sensor function for recognizing a fingerprint pattern by moving a finger while being in contact with the sensor surface 11b.

The electrodes 11a and the sensor surface 11b of the semiconductor element 11 are formed on the circuit formation surface (hereinafter, may be simply referred to as a front surface) of the semiconductor element 11, that is, the electrodes 11a and the sensor surface 11b are formed on the same surface of the semiconductor element 11. The electrodes 11a are arranged around the sensor surface 11b.

Wiring (may be referred to as redistribution wiring) 14 is formed on a back surface (a surface opposite to the sensor surface 11b and may be referred to as a reverse surface) of the semiconductor element 11, and the external connection terminals 12 are formed on the wiring 14.

Thus, since the electrodes 11a of the semiconductor element 11 are formed on the front surface of the semiconductor device 11 and the external connection terminals 12 are formed on the back surface of the semiconductor element 11, it is needed to electrically connect the electrodes 11a with the electrode connection terminals 12. In the present embodiment, connection parts 15a, which extend from the front surface to the back surface of the semiconductor element 11 in a peripheral portion of the semiconductor element 11, are provided so as to electrically connect the electrodes 11a and the external connection terminals 12 with each other. The connection parts 15 are formed by forming through holes in the semiconductor element 11 and filling a conductive material such as metal in the through holes.

The external connection terminals 12 are pillar-like electrodes, and the end surfaces thereof are covered by protective metal layers 12a. The back surface of the semiconductor element 11 is covered by the seal resin 13B, and portions of the external connection terminals 12 provided with the protective metal layers 12a protrude slightly from the surface of the seal resin 13B.

On the other hand, the front side of the semiconductor element 11 other than the sensor surface 11 is covered by the seal resin 13A. That is, the electrodes 11a arranged around the sensor surface 11b and the end portions of the connection parts 15 are encapsulated by the seal resin 13A.

It should be noted that an insulation layer 16 is formed on the back surface of the semiconductor element 11, and the wiring 14 is formed on the insulation layer 16.

In the present embodiment, the electrodes 11a on the front surface are electrically connected to the wiring 14 on the back surface by providing the connection parts 15 made of a conductive material and extending through the semiconductor element 11 so as to electrically connect the electrodes 11a on the front surface and the external connection terminals 12 with each other. Accordingly, there is no need to provide a part protruding from an outer shape of the semiconductor element 11, and the outer shape of the semiconductor device 10 for fingerprint sensors is equal to the outer shape of the semiconductor element 11. Accordingly, an area (mounting area) occupied by the semiconductor device 10 for fingerprint sensors is reduced, which results in a minimum area that can be taken substantially.

Moreover, since the end portions of the external connection terminals 12 protrude from the seal resin 13B, the joining area for mounting increases (the side surface of the projected portion also serves as the joining area), which improves reliability of mounting.

Figure 4:
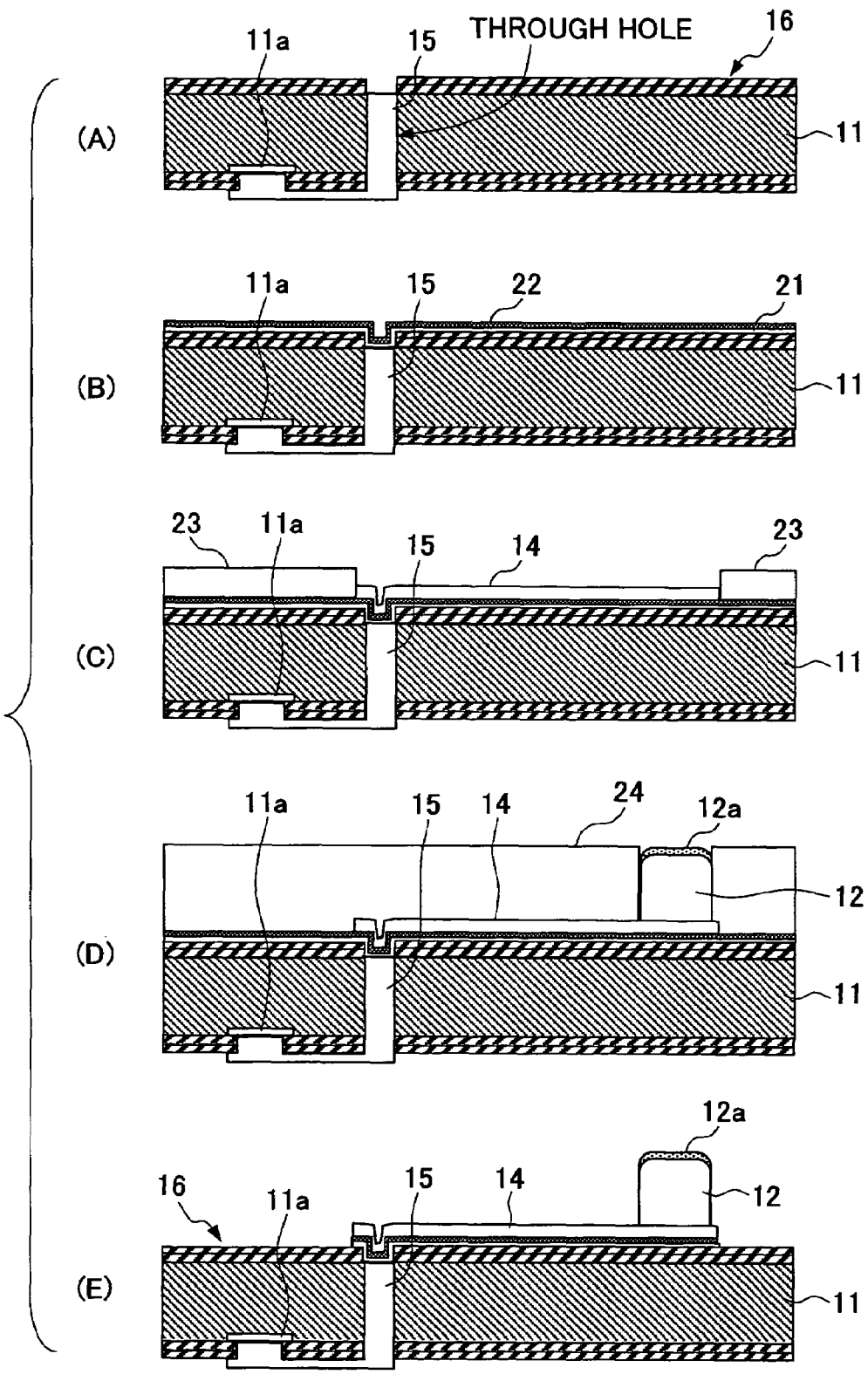
FIG. 4 is an illustration showing a process of forming a structure for electrically connecting electrodes and external connection terminals with each other.

A description will now be given of a process of forming a structure for electrically connecting the electrodes 11a and the external connection terminals 12 of the semiconductor element 11. FIG. 4 is an illustration showing a process of forming a structure for electrically connecting the electrodes 11a and the external connection terminals 12 with each other. It should be noted that a portion of the semiconductor element 11 is shown upside down in FIG. 3 with respect to the semiconductor element 11 shown in FIG. 3. The process explained below can be performed using a technique generally used in a manufacturing process of a semiconductor device, and only an outline of the process will be explained here.

First, as shown in FIG. 4-(A), through holes (only one shown in the figure) are formed in the vicinity of the electrodes 11a of the semiconductor element formed of a silicon substrate, and fill copper in the through holes by electrolytic copper (Cu) plating, and the copper in the through holes and the electrodes 11a are connected by copper plating. The copper filled in the through holes corresponds to the connection parts 15 shown in FIG. 3.

It should be noted that a passivation film and an insulation film (PSG/SiN) are formed on the front surface and the back surface of the semiconductor element 11 (or the silicon wafer), and an insulation cover film formed of polyimede resin, etc., is formed thereon. The insulation layer 16 in FIG. 3 shall contain the passivation film, the insulation film and the insulation cover film. The through holes are formed by penetrating also the insulation layer 16, and the insulation layer 16 on the electrode 11a are also removed and, similar to the through holes, copper is filled by an electrolytic copper plating.

Then, as shown in FIG. 4-(B), an adhesion metal layer 21 and a wiring priming metal layer 22 are formed on the entire back surface of the semiconductor element 11. The adhesion metal layer 21 and the wiring priming metal layer 22 are formed by depositing copper on the insulation layer 16 by sputtering or vapor deposition, and are portions serving as electrode for applying the electrolytic copper plating. Then, as shown in FIG. 4-(C), after forming a wiring resist 23 on the wiring priming metal layer 22, a part of the wiring resist 23 corresponding to the wiring 14 is removed, and the wiring 14 is formed in the portion from which the wiring resist 23 is removed by electrolytic copper plating.

Then, as shown in FIG. 4-(D), after removing the wiring resist 23, an external terminal resist 24 is formed, and a part of the wiring 14 is exposed by removing a portion of the external terminal resist 24 corresponding to the external terminals, and the external connection terminals 12 are formed by depositing copper thereon by electrolytic copper plating. Then, the protective metal layers 12a are formed on the exposed surfaces of the external connection terminals 12 in a state where the external terminal resist 24 is remaining.

The protective metal layers 12a generally have dual-layer structure in which, for example, gold (Au) is coated on nickel (Ni). Additionally, a photo-resist is generally used as the external terminal resist 24.

Subsequently, as shown in FIG. 4-(E), the external terminal resist 24 is removed, and the exposed wiring priming metal layer 22 and the adhesion metal layer 21 underneath are removed by etching.

According to the above-mentioned processes, the electrodes 11a on the front surface of the semiconductor element 11 and the external connection terminals 12 formed on the back surface are electrically connected by the connection parts 15.

By forming the external connection terminals 12 in the above-mentioned process, the semiconductor device 10 for fingerprint sensors can be formed without using an interposer, and the semiconductor device 10 for fingerprint sensors of the same size as the semiconductor element 11 can be formed. Therefore, the mounting area of the semiconductor device 10 for fingerprint sensors can be reduced.

Figure 5:
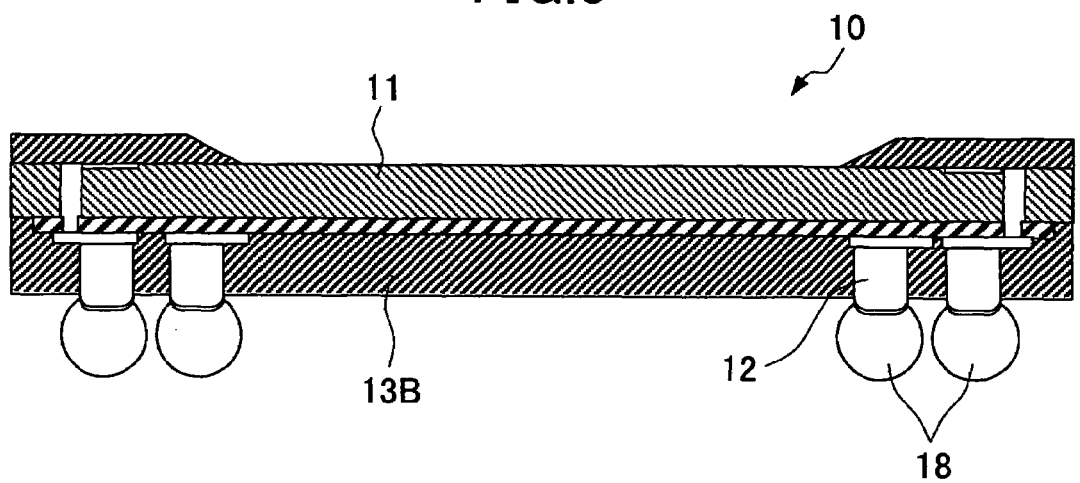
FIG. 5 is a cross-sectional view of the semiconductor device for fingerprint sensors shown in FIG. 3 in which solder balls are provided to external connection terminals.
Figure 6:
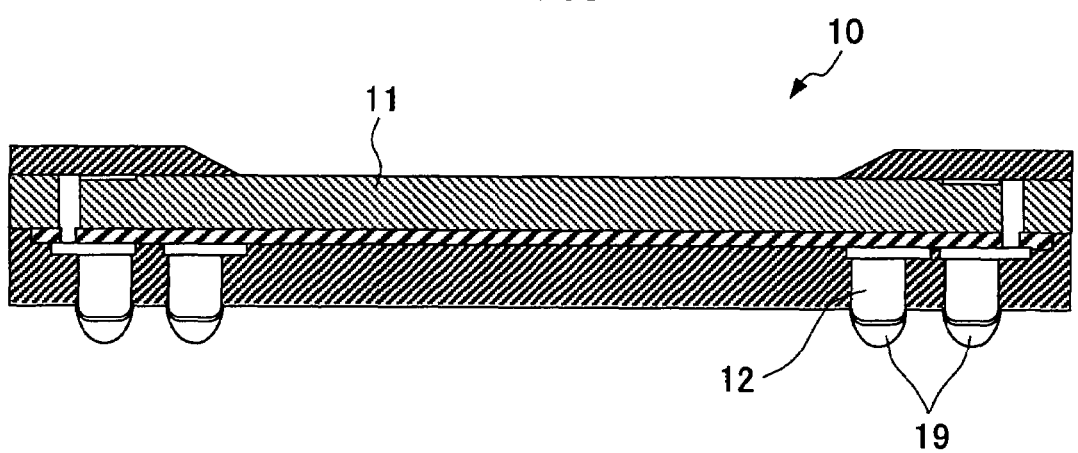
FIG. 6 is a cross-sectional view of the semiconductor device for fingerprint sensors shown in FIG. 3 in which solder balls are provided to external connection terminal parts.

Before the above-mentioned semiconductor device 10 for fingerprint sensors is incorporated into the equipment, joining members for substrate mounting are provided to the external connection terminals 12. In the example shown in FIG. 5, solder balls 18 are provided to the external connection terminals 12. Moreover, in the example shown in FIG. 6, solder coats 19 are formed on the external connection terminals 12 by coating solder on the exposed surfaces of the external connection terminals 12.

When mounting the semiconductor device 10 for fingerprint sensors on a board, the external connection terminals 12 are joined to the terminals of the board by solidifying the solder balls 18 or the solder coats 19 after melting them by solder reflow. In this process, the solder adheres also to side surfaces of the external connection terminals 12 protruding from the seal resin 13B, and, thus, the joining area is increased by the area of the side surfaces, thereby improving reliability.

Figure 7:
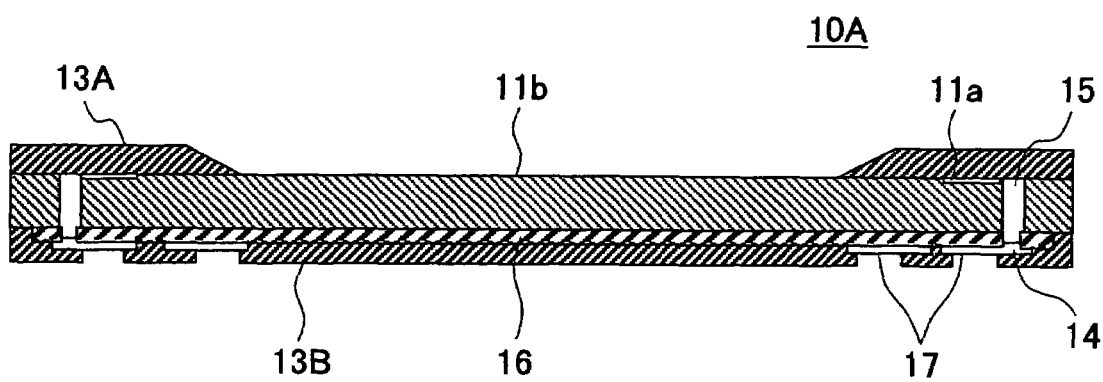
FIG. 7 is a cross-sectional view of the semiconductor device for fingerprint sensors according to a second embodiment of the present invention.

A description will now be given, with reference to FIG. 7, of a semiconductor device for fingerprint sensors according to a second embodiment of the present invention. FIG. 7 is a cross-sectional view of the semiconductor device for fingerprint sensors according to the present invention. In FIG. 7, parts that are the same as the parts shown in FIG. 3 are given the same reference numerals.

The semiconductor device 10A for fingerprint sensors shown in the FIG. 7 comprises a semiconductor element 11 having electrodes 11a, external connection terminal parts 17 formed on the semiconductor element 11 on a side opposite to the electrodes 11a, a seal resin 13B provided on the side of the external connection terminal parts 17, and a seal resin 13A provided on the side of a sensor surface 11b.

The electrodes 11a and the sensor surface 11b of the semiconductor element 11 are formed on the circuit formation surface (hereinafter, may be simply referred to as a front surface) of the semiconductor element 11, that is, the electrode 11a and the sensor surface 11b are formed on the same surface of the semiconductor element 11. The electrodes 11a are arranged around the sensor surface 11b.

Wiring (may be referred to as redistribution wiring) 14 is formed on a back surface (a surface opposite to the sensor surface 11b and may be referred to as a reverse surface) of the semiconductor element 11, and the external connection terminal parts 17 are formed on the wiring 14. Although the external connection terminal parts 17 are parts serving as external connection terminals, they are referred to as the external connection terminal parts since they may be integrally formed with the wiring 14.

Thus, since the electrodes 11a of the semiconductor element 11 are formed on the front surface of the semiconductor device 11 and the external connection terminal parts 17 are formed on the back surface of the semiconductor element 11, it is needed to electrically connect the electrodes 11a with the electrode connection terminal parts 17. In the present embodiment, connection parts 15a, which extend from the front surface to the back surface of the semiconductor element 11 in a peripheral portion of the semiconductor element 11, are provided so as to electrically connect the electrodes 11a and the external connection terminal parts 17 with each other. The connection parts 15 are formed by forming through holes in the semiconductor element 11 and filling a conductive material such as metal in the through holes.

In the present embodiment, the external connection terminal parts 17 correspond to a part of the wiring 14 provided with a protective metal layer. The back surface of the semiconductor element 11 is covered by the seal resin 13B except for the portions where the external connection terminal parts 17 are provided. That is, openings are provided in the seal resin 13B so that the external connection terminal parts are exposed in the openings.

On the other hand, the front side of the semiconductor element 11 other than the sensor surface 11 is covered by the seal resin 13A. That is, the electrodes 11a arranged around the sensor surface 11b and the end portions of the connection parts 15 are encapsulated by the seal resin 13A.

It should be noted that an insulation layer 16 is formed on the back surface of the semiconductor element 11, and the wiring 14 is formed on the insulation layer 16.

In the present embodiment, the electrodes 11a on the front surface are electrically connected to the wiring 14 on the back surface by providing the connection parts 15 made of a conductive material and extending through the semiconductor element 11 so as to electrically connect the electrodes 11a on the front surface and the external connection terminal parts 17 with each other. Accordingly, there is no need to provide a part protruding from an outer shape of the semiconductor element 11, and the outer shape of the semiconductor device 10A for fingerprint sensors is equal to the outer shape of the semiconductor element 11. Accordingly, an area (mounting area) occupied by the semiconductor device 10A for fingerprint sensors is reduced, which results in a minimum area that can be taken substantially. Additionally, since the external connection terminals are formed without being separated from the wiring 14, a manufacturing cost can be reduced. A further cost reduction can be achieved by forming the wiring 14 by only a sputtered metal film.

Figure 8:
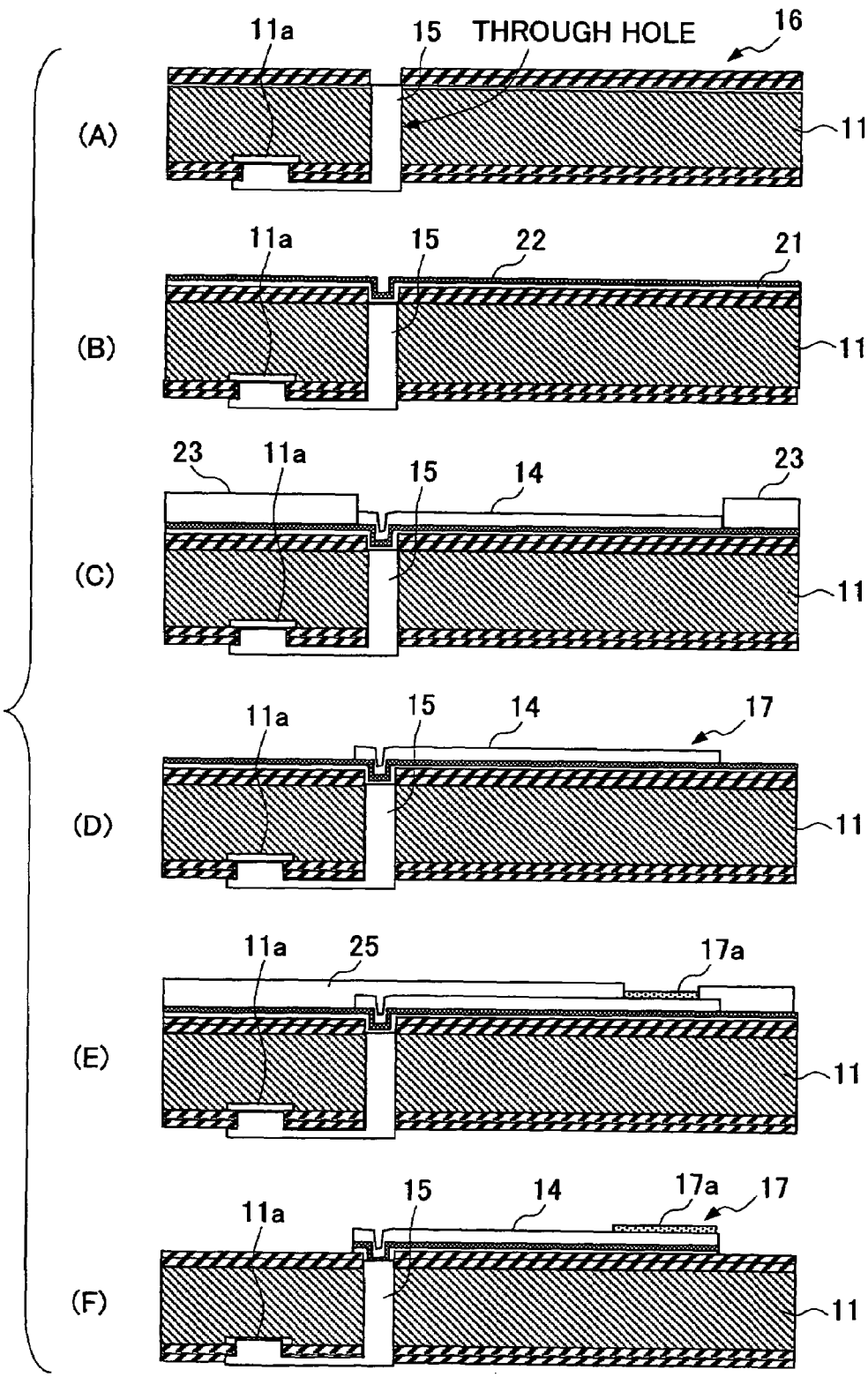
FIG. 8 is an illustration showing a process of forming a structure for electrically connecting electrodes and external connection terminal parts with each other.

A description will now be given of a process of forming a structure for electrically connecting the electrodes 11a and the external connection terminal parts 17 of the semiconductor element 11. FIG. 8 is an illustration showing a process of forming a structure for electrically connecting the electrodes 11a and the external connection terminal parts 17 with each other. It should be noted that a portion of the semiconductor element 11 is shown upside down in FIG. 8 with respect to the semiconductor element 11 shown in FIG. 7. The process explained below can be performed using a technique generally used in a manufacturing process of a semiconductor device, and only an outline of the process will be explained here.

Here the process shown in FIG. 8-(A) through FIG. 8-(C) is the same as the process shown FIG. 4-(A) through FIG. 4-(C), and descriptions thereof will be omitted.

After the process shown in FIG. 8-(C) is completed, then, as shown in FIG. 8-(D), the wiring resist 23 is removed so as to expose the wiring 14. The wiring 14 includes portions corresponding to the external connection terminal parts 17.

Then, as shown in FIG. 8-(E), after covering wiring 14 with the resist 25 for external connection terminal parts and forming openings by removing portions of the resist 25 corresponding to the external connection terminal parts 17, a protective metal layer 17a is formed on portions of the wiring 14 that are exposed in the openings. The protective metal layer 17a has a dual-layer structure of, for example, nickel (Ni) plating and gold (Au) plating.

Then, after entirely removing the resist 25 for external connection terminal parts, the exposed wiring priming metal layer 22 and the adhesion metal layer 21 underneath are removed by etching. The portion in which the protective metal layer 17a is provided on the wiring 14 serves as the external connection terminal parts 17. However, if the protective metal layer 17a is not needed, the process shown in FIG. 8-(E) is omitted, and the portions of the wiring 14 exposed from the seal resin 13B serves as the external connection terminal parts 17.

According to the above-mentioned process, the structure, in which the electrodes 11a on the front surface and the external connection terminal parts 17 formed on the back surface of the semiconductor element 11 are electrically connected by the connection parts 15, is formed.

By forming the external connection terminal parts 17 in the above-mentioned process, the semiconductor device 10A for fingerprint sensors can be formed without using an interposer, and the semiconductor device 10A for fingerprint sensors of the same size as the semiconductor element 11 can be formed. Therefore, the mounting area of the semiconductor device 10A for fingerprint sensors can be reduced.

Figure 9:
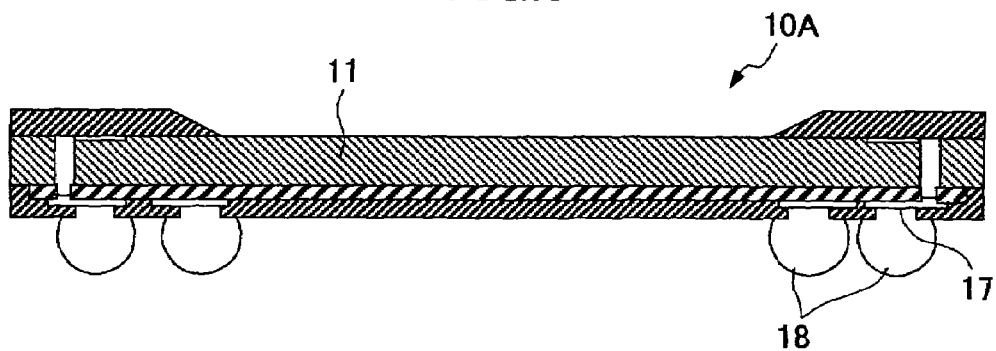
FIG. 9 is a cross-sectional view of the semiconductor device for fingerprint sensors shown in FIG. 7 in which solder balls are provided to external connection terminals.
Figure 10:
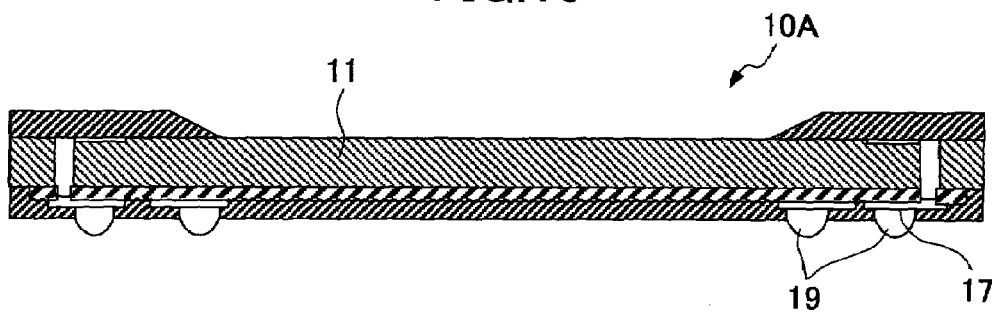
FIG. 10 is a cross-sectional view of the semiconductor device for fingerprint sensors shown in FIG. 7 in which solder balls are provided to external connection terminal parts.

Before the above-mentioned semiconductor device 10A for fingerprint sensors is incorporated into the equipment, joining members for substrate mounting are provided to the external connection terminal parts 17. In the example shown in FIG. 9, solder balls 18 are provided to the external connection terminal parts 12. Moreover, in the example shown in FIG. 9, solder coats 19 are formed on the external connection terminal parts 17 by coating solder on the exposed surfaces of the external connection terminal parts 17.

When mounting the semiconductor device 10A for fingerprint sensors on a board, the external connection terminal parts 17 are joined to the terminals of the board by solidifying the solder balls 18 or the solder coats 19 after melting them by solder reflow.

Figure 11:
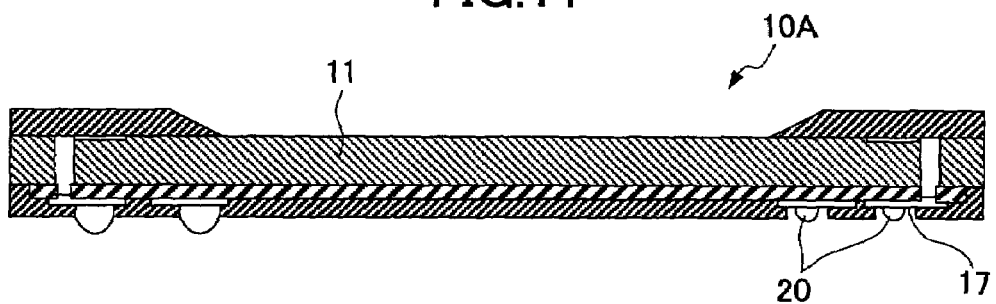
FIG. 11 is a cross-sectional view of the semiconductor device for fingerprint sensors shown in FIG. 7 in which protruding terminals are provided to external connection terminal parts.

Further, in the example shown in FIG. 11, protruding terminals 20 are provided on the external connection terminal parts 17. The protruding terminals 20 are stud bumps or the like formed by wire bonding. The protruding terminals 20 are connected to the terminal of the board by, for example, an electrically conductive adhesive or the like.

The semiconductor devices 10 and 10A according to the above-mentioned embodiments can be manufactured efficiently by individualizing each of them after forming a plurality of pieces on one sheet of a silicon wafer. A description will be given below of an advantage when a plurality of semiconductor devices for fingerprint sensors (hereinafter, simply referred to as a semiconductor device) are manufactured in a wafer state. It should be noted that manufacturing of the semiconductor device 10 shown in FIG. 3 will be explained as an example.

Figure 12:
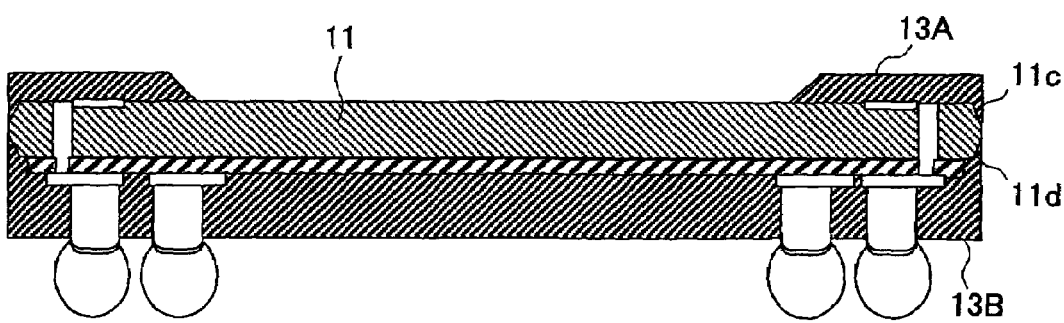
FIG. 12 is a cross-sectional view of the semiconductor device shown in FIG. 3 in which a side surface is covered by seal resin.

FIG. 12 is a cross-sectional view of the semiconductor device 10 in which the side surface is also covered by the seal resin. In the semiconductor device 10 shown in FIG. 12, slanting surfaces extending from the front surface and the back surface are formed on side surfaces (outer surfaces) of the semiconductor element 11. The slanting surface 11c extending from the front surface is covered by the upper seal resin 13A, and the slanting surface 11d extending from the back surface is covered with the lower seal resting 13B.

Thus, by encapsulating also the side surfaces, boundaries between the semiconductor element 11 and each of the seal resins 13A and 13B are protected from a stress such as an external shock, and the semiconductor element 11 is prevented from chipping or cracking. Additionally, since the adhesion area between the semiconductor element and each of the seal resins 13A and 13B is increased, a resin adhesion strength is improved, which improves reliability of the semiconductor device 10.

It should be noted that although the slanting surfaces 11c and 11d extending from both the front surface and the back surface are provided in the example shown in FIG. 12, the slanting surface is not always need to be provided on both sides and may be provided on only one side.

A description will be given, with reference to FIG. 13, of a forming method of the above-mentioned slanting surface 11c. It is assumed that a plurality of semiconductor devices 10 are manufactured collectively in a wafer (substrate) state. When manufacturing the semiconductor device 10 in a wafer state, the semiconductor devices 10 connected with each other on the wafer are individualized by cutting by dicing. In this case, a half-cutting is applied by a dicing blade 26 having a width larger than a dicing blade used for completely cutting the wafer as shown in FIG. 13-(A) through FIG. 13-(C). By making a cutting edge of the dicing blade 26 in a V-shape, the slanting surface 11c is formed on the semiconductor element 11. In the example shown in FIG. 13, the slanting surfaces 11c are formed on the semiconductor elements on both sides simultaneously.

After the slanting surfaces 11c are formed, the entire wafer is encapsulated by resin as shown in FIG. 13-(D) so as to form the seal resin 13A on the semiconductor elements 11. At this time, the seal resin is filled in the V groove formed by the half-cut.

After the resin encapsulation, the wafer is cut along dicing lines by using the dicing blade 27 having a width smaller than the dicing blade 26 for half-cut so that the semiconductor devices 10 each having the slanting surfaces 11c covered by the seal resin 13A are individualized. In other words, the seal resin is formed on the side surfaces of the semiconductor element 11 by forming a groove having a width larger than the width cut off by dicing.

As mentioned above, by forming the V groove in a wafer state, the slanting surfaces can be easily formed on the semiconductor element 11, and, thus, the semiconductor device 10 having portions of the semiconductor element 11 covered with seal resin can be easily formed.

It should be noted that the sealing configuration of the side surfaces of the semiconductor element can be changed by changing the shape of the V-groove by changing the cutting edge shape of the dicing blade 26 for the half-cut.

A description will now be given, with reference to FIG. 14 and FIG. 15, of a case of using different kinds of resin for the front side and the back side of the semiconductor element.

Figure 14:
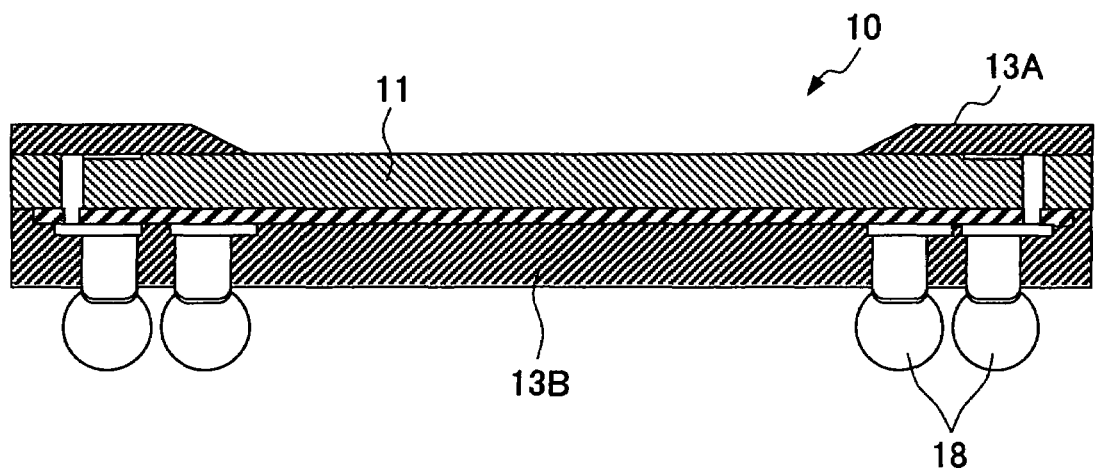
FIG. 14 is a cross-sectional view showing an example in which different kinds of resin are used for a seal resin on the front side (sensor surface side) and a seal resin on the back side (mounting surface side) in the semiconductor device shown in FIG. 3.

FIG. 14 is a cross-sectional view showing an example in which different kinds of resin are used for the seal resin 13A on the front side (sensor surface side) and the seal resin 13B on the back side (mounting surface side) in the semiconductor device 10 shown in FIG. 3.

In the example shown in FIG. 14, the seal resins 13A and 13B are formed by compression molding on both the sensor surface and the mounting surface. In this case, as for the kinds of resin, moldable epoxy resin is selected. The selection should be made so that resin for the seal resin 13B used for the sensor surface side has a linear expansion coefficient larger than resin for the seal resin 13A used for the sensor surface side. Accordingly, a resin separation due to an environmental stress can be prevented by selecting resin having excellent matching (small α) with the sensor surface with respect to the sensor surface side, while the mounting environment stress resistance is improved by selecting resin close to the mounting board (large V) with respect to the mounting surface side.

Figure 15:
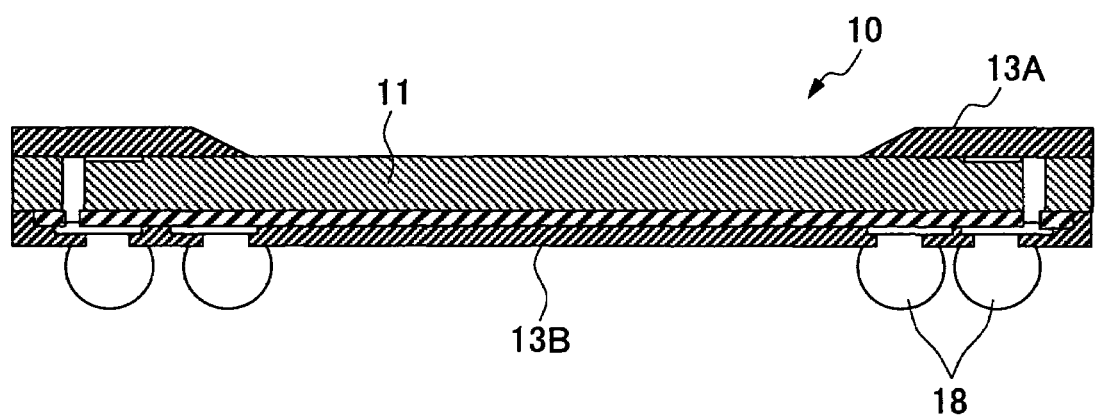
FIG. 15 is a cross-sectional view showing an example in which different kinds of resin are used for a seal resin on the front side (sensor surface side) and a seal resin on the back side (mounting surface side) in the semiconductor device shown in FIG. 7.

In an example shown in FIG. 15, the seal resin 13A is formed on the sensor surface side by compression molding, and the seal resin 13B is formed by applying liquid resin by printing or spin coating on the mounting surface side. If, for example, a photosensitive resin such as a polyimede resist, an epoxy resist or the like is used for the seal resin on the mounting surface side, the openings for exposing the external connection terminal parts can be formed by a patterning process of the photosensitive resin.

Moreover, if a warp tends to occur in the wafer in the process in a wafer state, the warp can be prevented by selecting resins having different characteristics for the front side and the back side of the wafer, respectively.

A description will now be given, with reference to FIG. 16, of a process of manufacturing a plurality of semiconductor devices 10 in a wafer (substrate) state in a lump.

First, a plurality of semiconductor devices 11 are formed in a lamp on a wafer which is a substrate for manufacturing semiconductor devices. Then, as shown in FIG. 16-(A), the connection parts 15 serving as electrically conductive parts are formed in each of the semiconductor elements 11 (electrode backside relocation process). Thereafter, wiring 14 is formed as shown in FIG. 16-(B), and external connection terminals 12 are formed on the wiring 14 (relocation wiring process).

Figure 16:
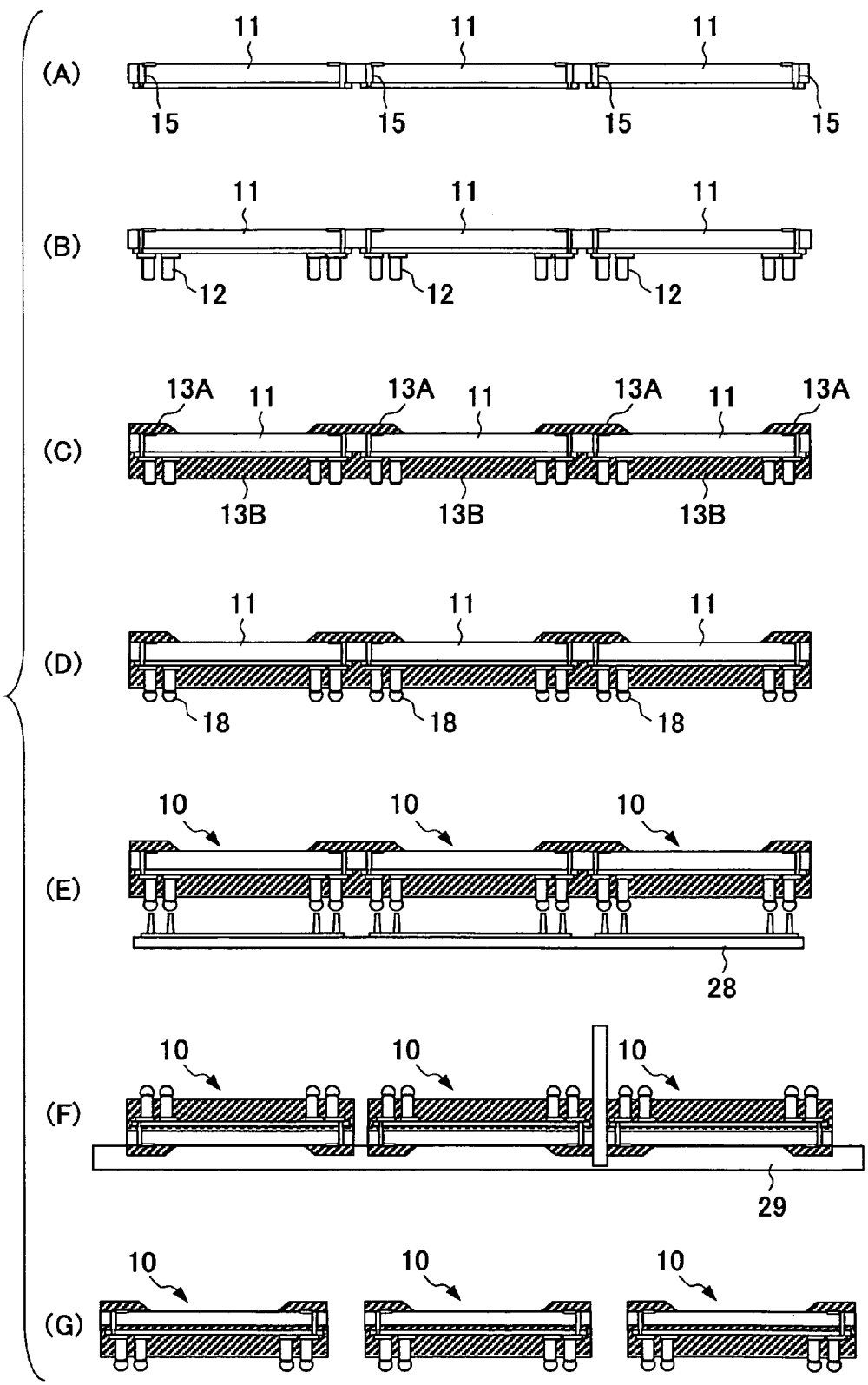
FIG. 16 is an illustration for showing a process of manufacturing the semiconductor devices shown in FIG. 3 in a lump.

Subsequently, as shown in FIG. 16-(C), the seal resin 13A and the seal resin 13B are formed on the front surface and the back surface of the wafer, respectively (resin-encapsulation process). Then, as shown in FIG. 16-(D), the solder balls 18 are provided on the ends of the external connection terminals 12 (terminal formation process).

Thereafter, as shown in FIG. 16-(E), a contactor 28 is brought into contact with each of the semiconductor devices 10 in a wafer state and an electric characteristic test is performed on each of the semiconductor devices 10.

Then, as shown in FIG. 16-(F), a dicing tape 29 is applied onto the front surface of the wafer and the wafer is turned upside down, and, then, the wafer is cut by dicing so as to individualize the semiconductor devices 10 (individual piece division process). Then, the individualized semiconductor devices 10 are pealed off from the dicing tape 29, and, thereby, the plurality of semiconductor devices 10 are manufactured in a lump as show in FIG. 16-(G).

According to the above-mentioned process, general purpose equipments can be used by unifying the wafer size, which enables reduction in development cost and equipment expenditures and reduction in manufacturing period. Additionally, since the assembling and test processing can be improved, further cost reduction can be achieved.

A description will now be given, with reference to FIG. 17 through FIG. 22, of a method of resin-encapsulating the semiconductor elements 11.

Figure 17:
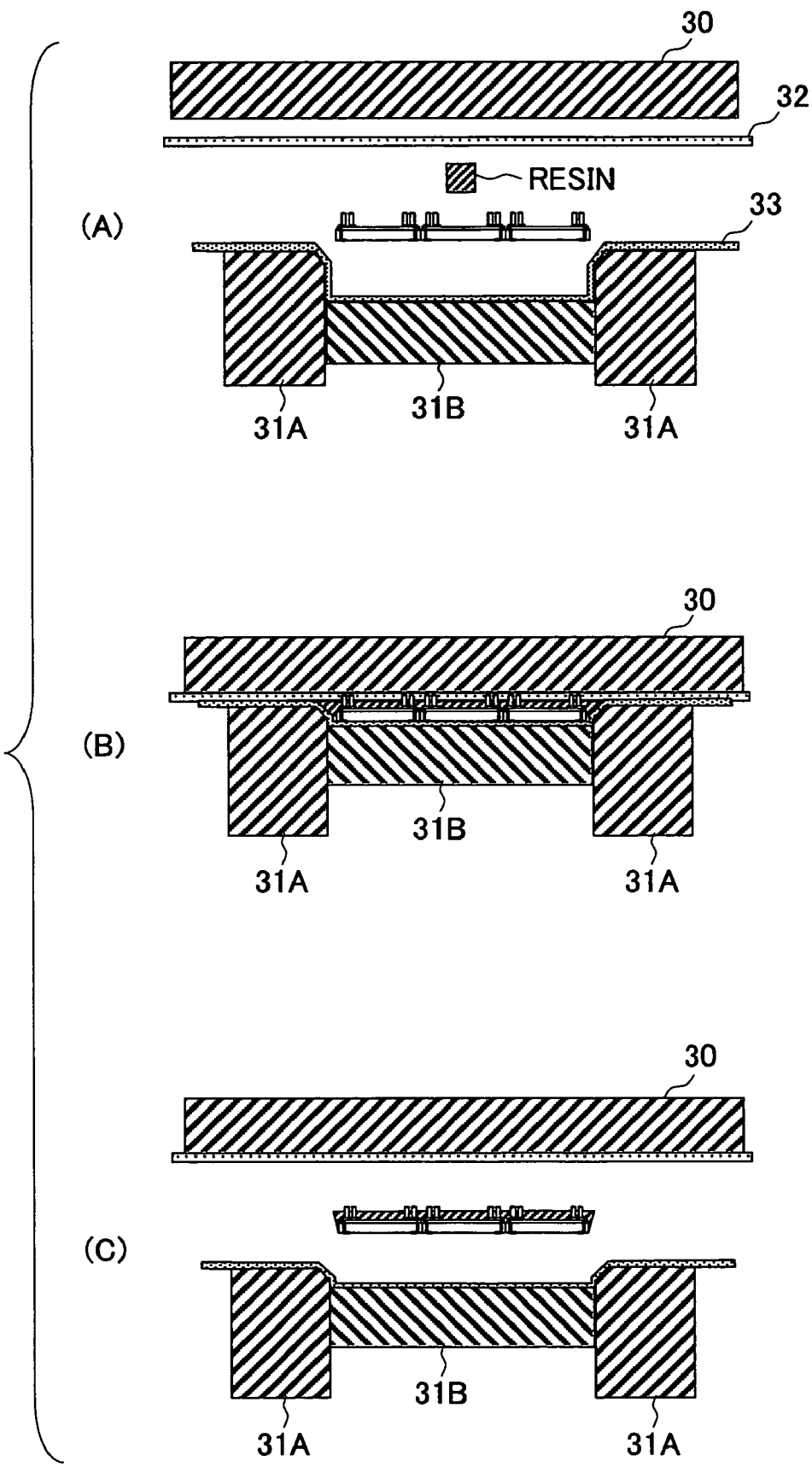
FIG. 17 is an illustration showing a resin-encapsulation process on a mounting surface side of a wafer.

First, as shown in FIG. 17-(A), the wafer on which the semiconductor elements 11 are formed, is placed in a mold die (an upper die 30 and lower dies 31A and 31B). At this time, the wafer is positioned in a state where the external connection terminals 12 face toward the upper die 30, and an elastic sheet material 32 is placed between the wafer and the upper die 30. A resin material is supplied between the elastic sheet material 32 and the wafer. The elastic sheet material 32 is a sheet material made of, for example, fluorocarbon resin which does not adhere to the resin. Additionally, a sheet material 33 also made of fluorocarbon resin is places between the wafer and the lower dies 31A and 31B.

By pressing the lower die 31B onto the upper die after closing the mold die, the supplied resin is fluidized so as to achieve compression molding. At this time, since the wafer is pressed against the upper die 30 by the lower die 31B, the ends of the external connection terminals 12 are changed from a state shown in FIG. 18-(A) to a state shown in FIG. 18-(B). That is, the ends of the external connection terminals 12 are set in the stated where they protrude into the elastic sheet material 32. The resin is fluidized in the mold die in the state shown in FIG. 18-(B), and, thereby, the seal resin 13B is formed by the compression molding.

Figure 18:
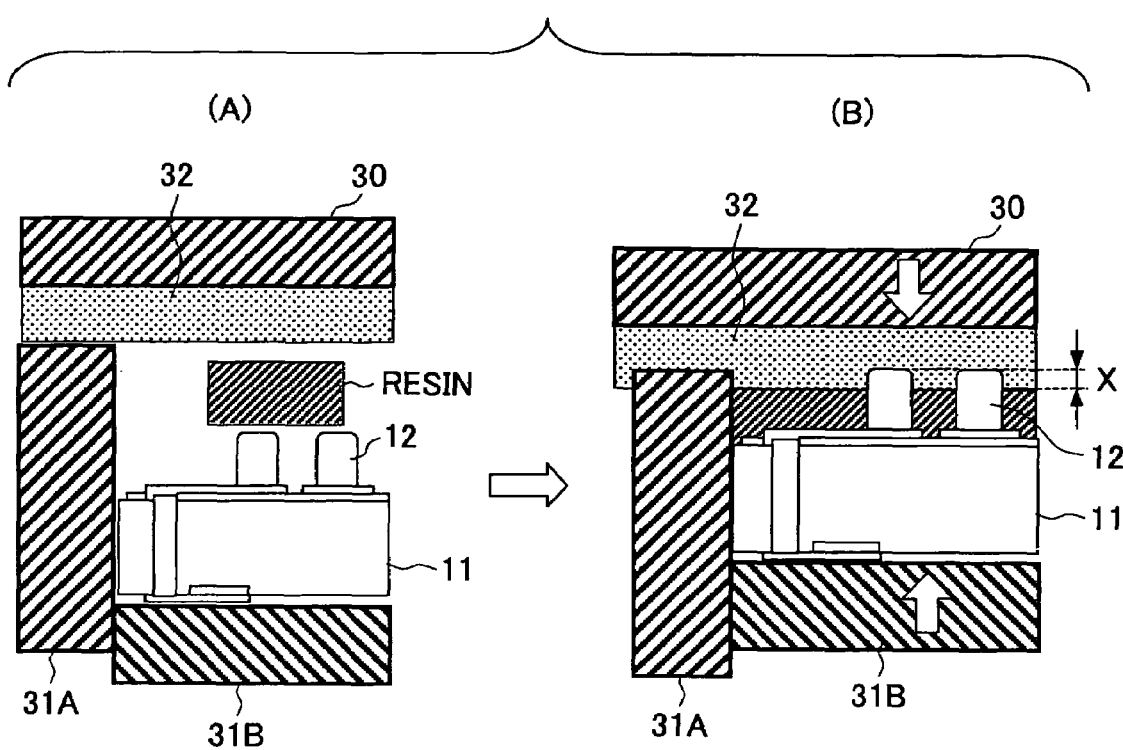
FIG. 18 is an illustration for explaining an action of an elastic sheet material.
Figure 19:
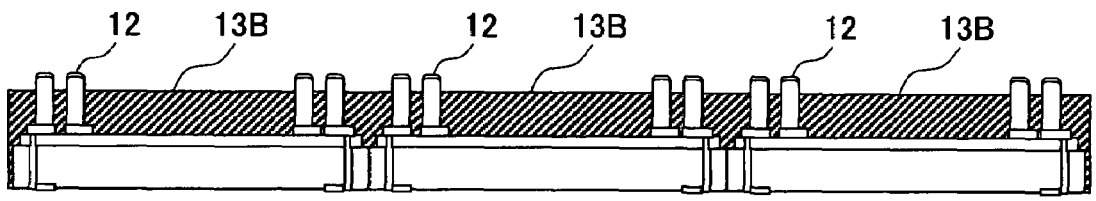
FIG. 19 is a cross-sectional view of a wafer taken out of the mold die.

After completion of the compression molding, the mold die is opened as shown in FIG. 17-(C), and the wafer whose backside is resin-encapsulated is taken out of the mold die. FIG. 19 is a cross-sectional view of the wafer taken out of the mold die. The portions of the external connection terminals 12, which have protruded into the elastic sheet material 32, protrude the seal resin 13B. An amount (distance) of protrusion of the external connection terminals 12 from the seal resin 13B is equal to an amount (distance) X of protrusion into the elastic sheet material 32 as shown in FIG. 18-(B).

It should be noted the elastic sheet material 32 and the sheet material 33 are sheets that do not adhere to the seal resin. Thus, using the sheets, molding can be performed without using a mold release agent that is usually contained in the resin to facilitate mold-releasing, which provides a resin layer (seal resin) of excellent adhesion. Additionally, by interposing the elastic sheet material 32, the sensor surface is prevented from being brought into contact with the mold die to protect the sensor surface.

Figure 20:
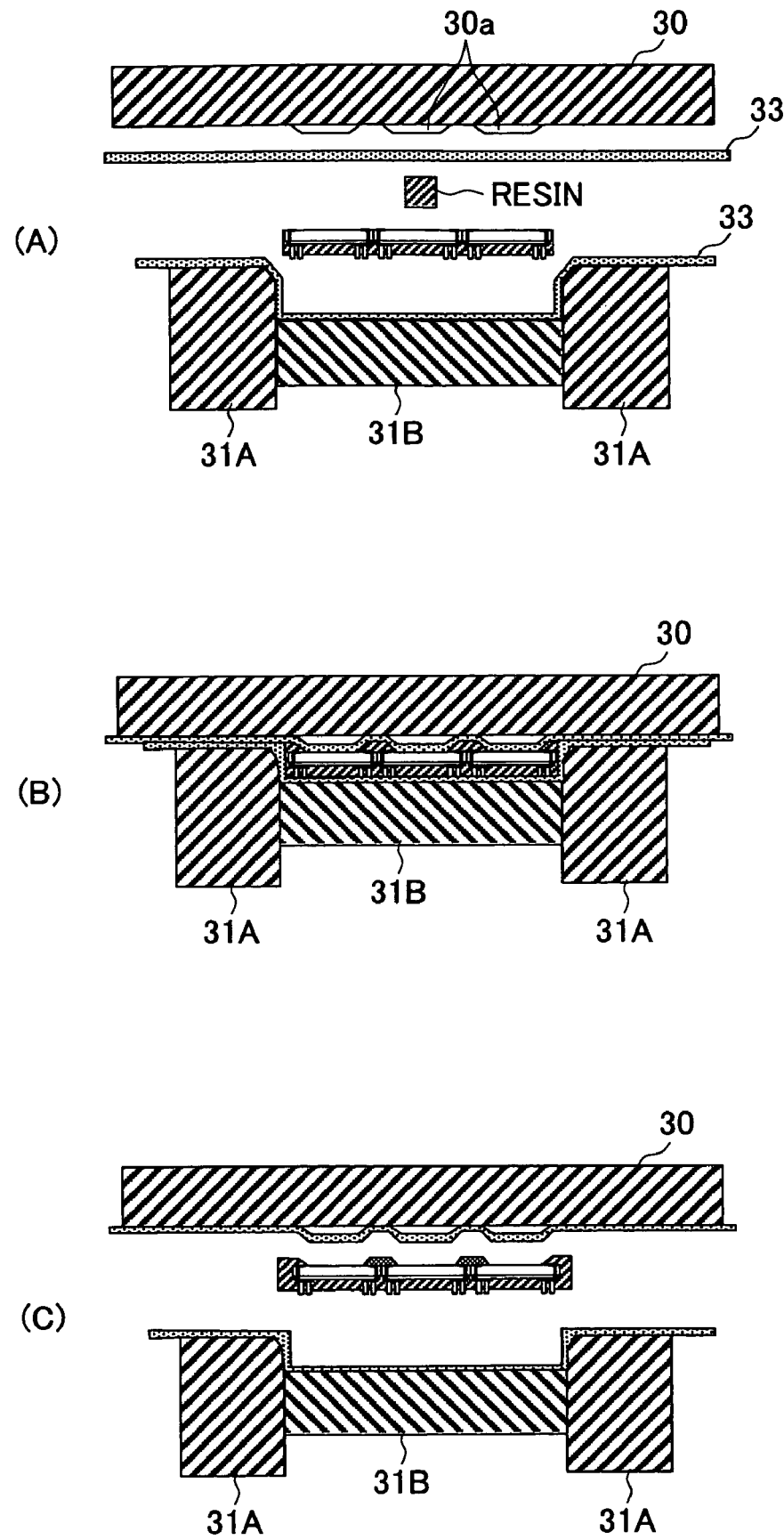
FIG. 20 is an illustration showing a resin-encapsulation process on a front side of the wafer.

After the resin-encapsulation is completed, resin-encapsulation is performed on the front side to the wafer. FIG. 20 is an illustration showing a resin-encapsulation process of the front side of the wafer. FIG. 20-(A) shows a state where the wafer is set to the mold die, FIG. 20-(B) shows a state where the mold die is closed and compression molding of resin is being performed, and FIG. 20-(C) shows a state where the compression molding is completed and the mold die is opened.

Similar to the resin-encapsulation process on the back side, the seal resin is molded by compression molding. However, the upper die 30 is provided with protruding parts 30a at positions corresponding to the sensor surfaces 11b of the semiconductor elements 11. When the wafer is set in the mold die and is pressed by the lower die 31B, the protruding parts 30a are brought into contact with the sensor surfaces of the semiconductor elements 11. Thereby, the seal resin cannot flow on the sensor surfaces 11b, and, as a result, the resin-encapsulation is achieved in a state where the sensor surfaces are exposed. It should be noted that a sheet material 33 is placed between the wafer and each of the upper die 30 and the lower dies 31A and 31B.

Figure 21A:
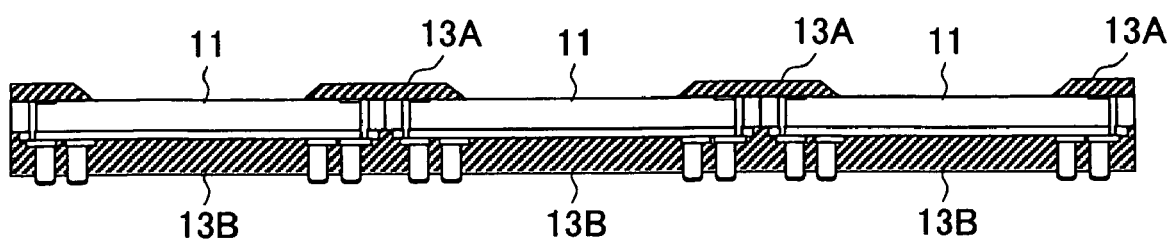
FIG. 21A is a cross-sectional view of the wafer in a state where it is taken out of a mold die.
Figure 21B:
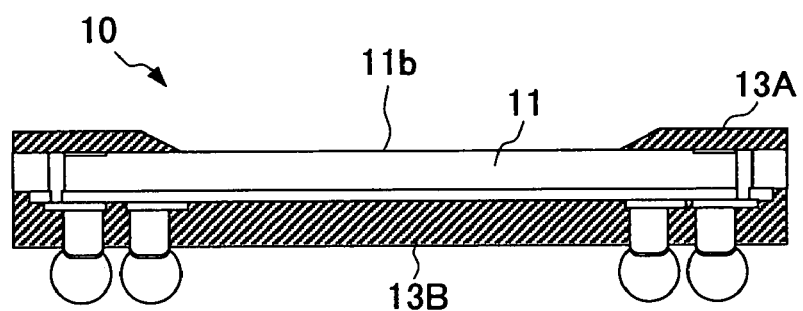
FIG. 21B is a cross-sectional view of the semiconductor device individualized by dicing.

FIG. 21A is a cross-sectional view of the wafer in a state where it is taken out of the mold die. A plurality of semiconductor devices 10 are individualized as shown in FIG. 21B by cutting the wafer along the boundaries of the semiconductor elements 11, that is, along the dicing lines.

Figure 22:
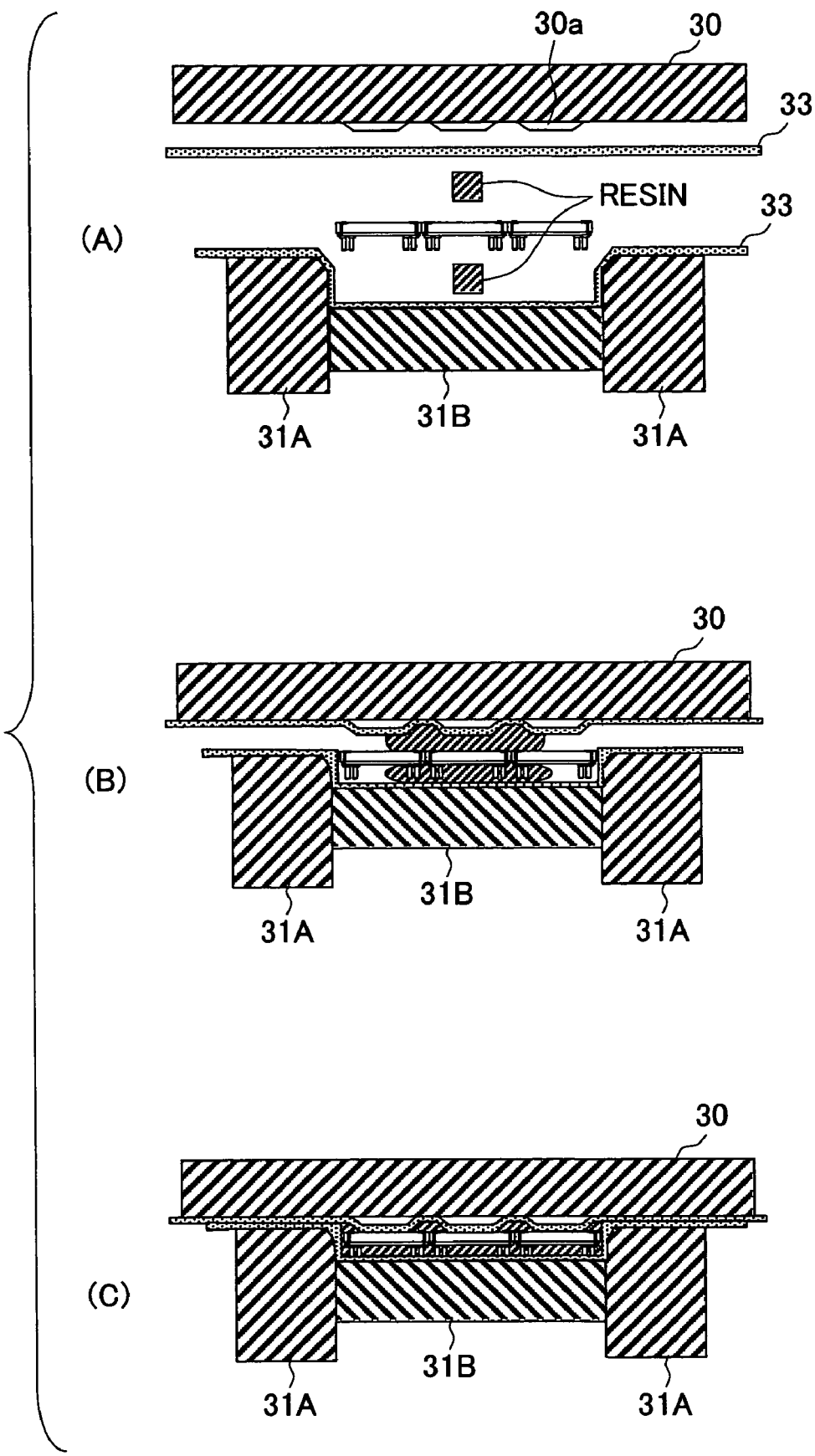
FIG. 22 is an illustration showing a process of simultaneously resin-encapsulating a sensor surface side and a mounting surface side.

It should be noted that although the resin-encapsulations on the back side and the front side are performed in different processes in the above-mentioned resin-encapsulation process, the resin-encapsulations on the back side and front side can be performed simultaneously using one mold die if, as shown in FIG. 22, the wafer is placed with the back side directed toward the lower die 31B and the sensor surfaces 11b directed toward the upper die, and the elastic sheet material 32 is places between the wafer and each of the lower mold die 31A and 31B, and protruding parts 30a are provided on the upper die 30.

Figure 23:
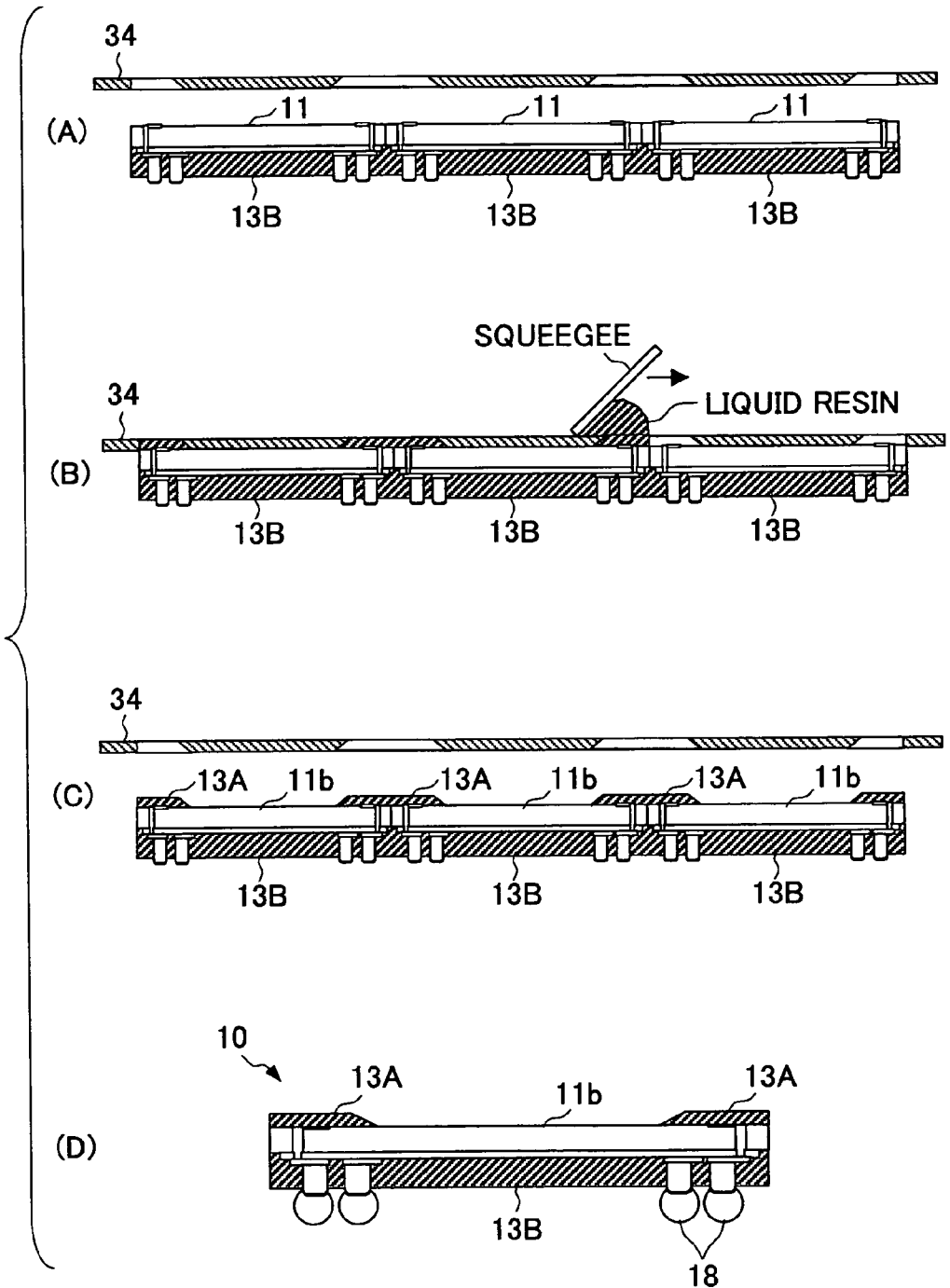
FIG. 23 is an illustration showing a process of resin-encapsulation by a printing method.

Moreover, the resin-encapsulation can be performed according to not the compression molding but a printing method. FIG. 23 is an illustration showing a process of resin-encapsulation by a printing method.

First, by performing the compression molding process shown in FIG. 17, the resin-encapsulation is performed so as to form the seal resin 13A. Then, as shown in FIG. 23-(A) a print mask 34, which has openings corresponding to the seal resin 13A is formed, is prepared. Then, as shown in FIG. 23-(B), a paste or liquid resin is filled in the openings of the mask 34 by using a squeegee on the front side of the wafer, and the applied resin is cured.

Then, when print mask 34 is removed from the wafer as shown in FIG. 23-(C), the seal resin 13A remains on the wafer in a state where the sensor surfaces 11b are exposed. Thereafter, as shown in FIG. 23-(D), the solder balls 18 are provided to the external connection terminals 12 and the wafer is diced so as to obtain a plurality of semiconductor devices 10.

Figure 24:
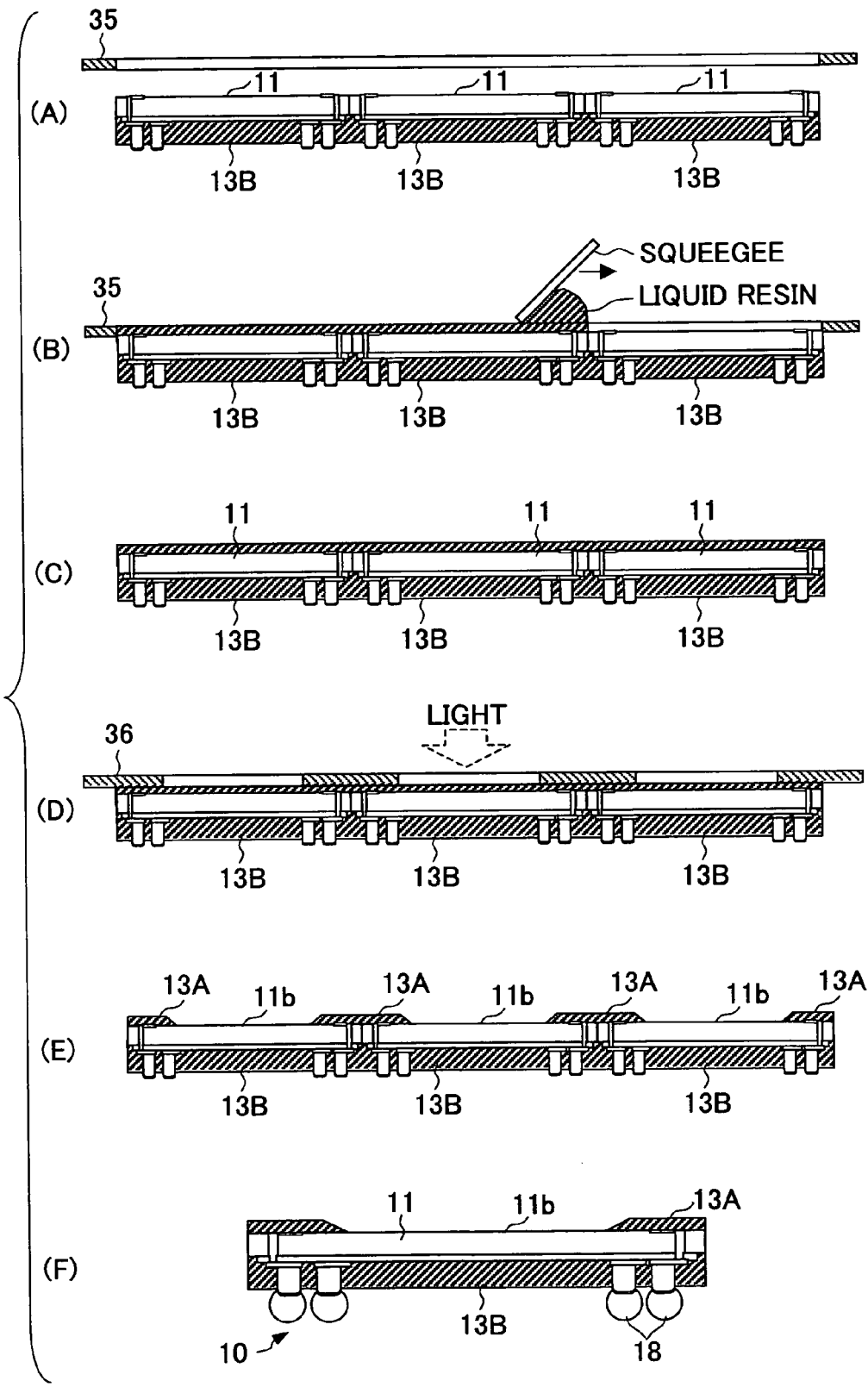
FIG. 24 is an illustration showing a resin-encapsulation process on the sensor surface side by using a patterning mask.

Moreover, the seal resin on the front side (sensor surface side) of the wafer may be a photo-curing resin so as to perform the resin-encapsulation using a patterning mask. FIG. 24 is an illustration showing the resin-encapsulation process on the sensor surface side by using the patterning mask.

First, the seal resin 13B is formed on the back side of the wafer by performing the compression molding process shown in FIG. 17. Then, a mask 35, which has an opening having the same size as the wafer, is prepared. Then, as shown in FIG. 24-(B), the mask is placed on the front surface of the wafer and a paste of liquid photo-curing resin is filled in the opening of the mask 35 by using a squeegee so as to apply the photo-curing resin on the entire surface of the wafer as shown in FIG. 24-(C).

Subsequently, as shown in FIG. 24-(D), the photo-curing resin is exposed to a light through a patterning mask 36 and is cured. The patterning mask 36 is patterned so that a light can be irradiated onto a portion of the semiconductor elements 11 excluding the sensor surfaces 11b. Accordingly, the photo-curing resin corresponding to the sensor surfaces 11b are not cured and only the portion other than the sensor surfaces 11b is cured.

Therefore, as shown in FIG. 24-(E), by removing the portion of the photosensitive resin which has not been cured, the sensor surfaces 11b are exposed, and the portion of the photosensitive resin corresponding to the seal resin 13A remains on the wafer. Thereafter, as shown in FIG. 24-(F), after providing the solder balls 18 on the external connection terminals 12, the wafer is diced so as to obtain a plurality of semiconductor devices 10.

Figure 25:
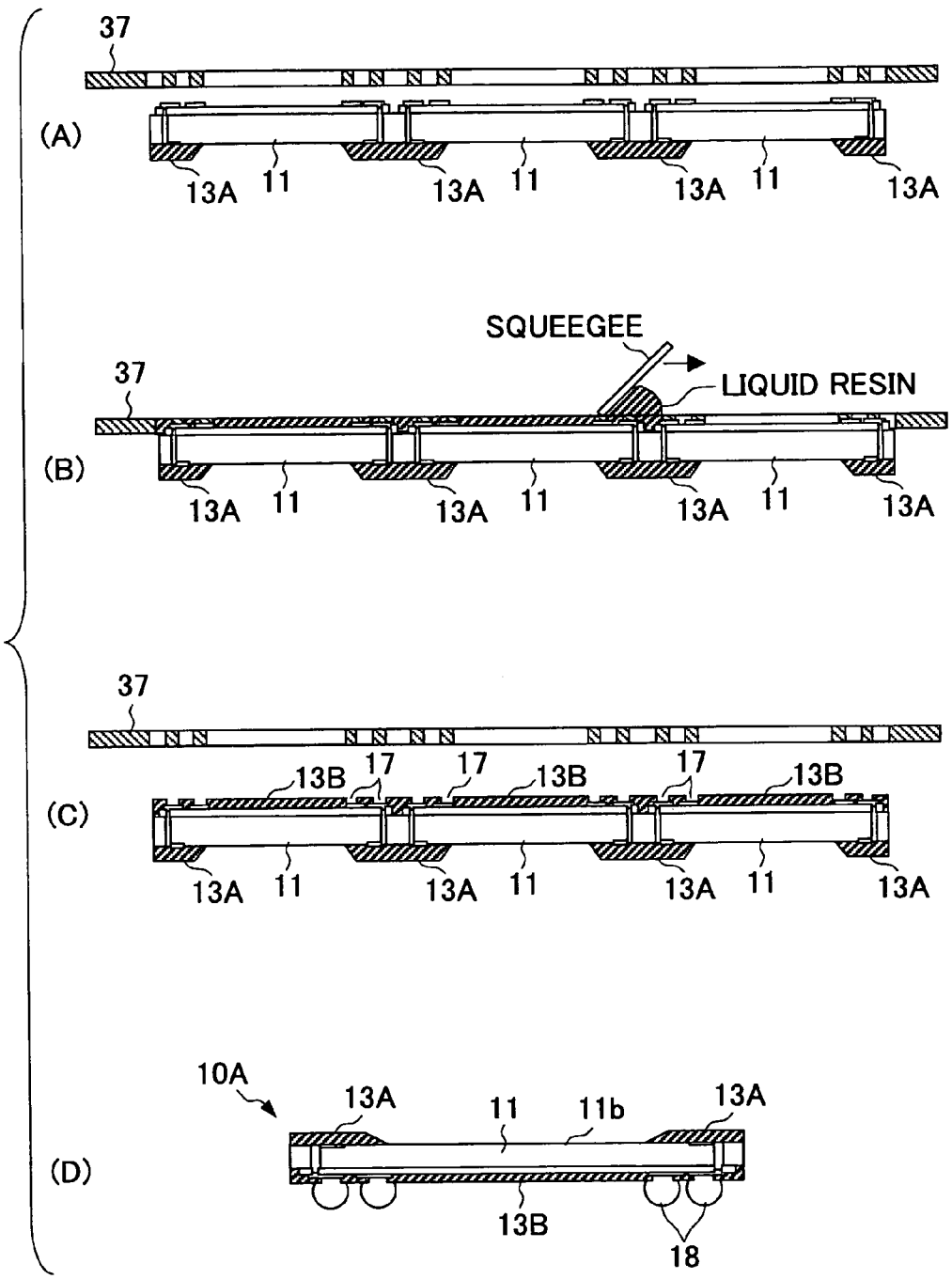
FIG. 25 is an illustration showing a resin-encapsulation process by a printing method on the back side of the wafer.

Additionally, the resin-encapsulation may be performed on the back surface side (mounting surface side) by using a printing method. FIG. 25 is an illustration showing a process of resin-encapsulation by a printing method on the back side of the wafer.

First, by performing the compression molding process shown in FIG. 20, the resin-encapsulation on the front side (sensor surface side) of the wafer is performed so as to form the seal resin 13A. Then, as shown in FIG. 25-(A) a print mask 37, which has openings corresponding to the seal resin 13B is formed, is prepared. Then, as shown in FIG. 25-(B), a paste or liquid resin is filled in the openings of the print mask 37 by using a squeegee on the front side of the wafer, and the applied resin is cured.

Then, when print mask 37 is removed from the wafer as shown in FIG. 25-(C), the seal resin 13B remains on the wafer in a state where the external connection terminal parts 17 are exposed. Thereafter, as shown in FIG. 25-(D), the solder balls 18 are provided to the external connection terminal parts 17 and the wafer is diced so as to obtain a plurality of semiconductor devices 10A.

Figure 26:
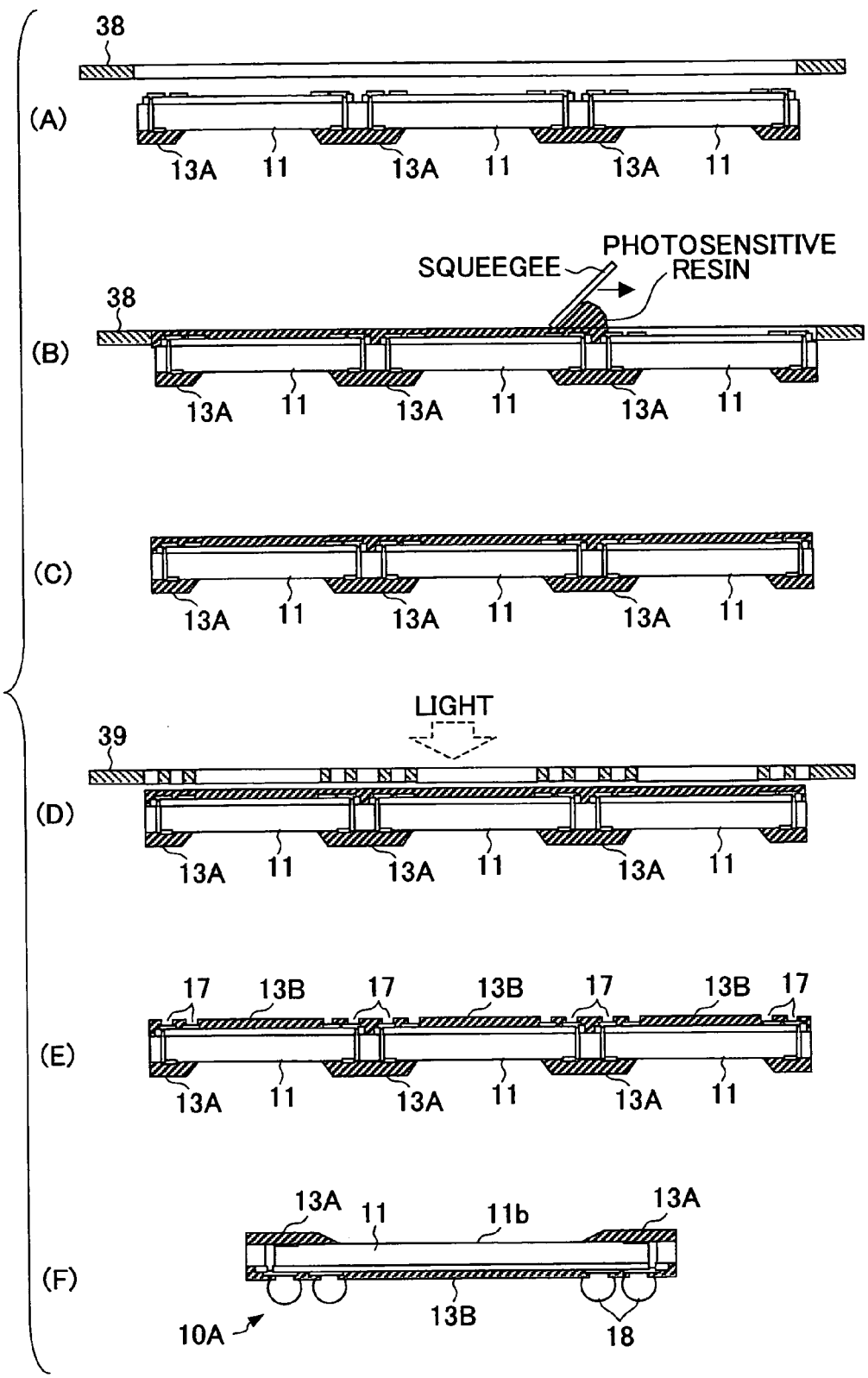
FIG. 26 is an illustration showing the resin-encapsulation process on the mounting surface side by using a patterning mask.

Moreover, the seal resin on the back side (mounting surface side) of the wafer may be a photo-curing resin so as to perform the resin-encapsulation using a patterning mask. FIG. 26 is an illustration showing the resin-encapsulation process on the mounting surface side by using the patterning mask.

First, the seal resin 13B is formed on the back side of the wafer by performing the compression molding process shown in FIG. 20. Then, a mask 38, which has an opening having the same size as the wafer, is prepared as shown in FIG. 26-(A). Then, as shown in FIG. 26-(B), the mask 38 is placed on the back surface of the wafer and a paste of liquid photo-curing resin is filled in the opening of the mask 38 by using a squeegee so as to apply the photo-curing resin on the entire back surface of the wafer as shown in FIG. 26-(C).

Subsequently, as shown in FIG. 26-(D), the photo-curing resin is exposed to a light through a patterning mask 39 and is cured. The patterning mask 39 is patterned so that a light can be irradiated onto a portion of the semiconductor elements 11 to which the seal resin 13B is provided. Accordingly, the photo-curing resin corresponding to the portions where the external connection terminal parts 17 are exposed are not cured and only the portion other than that is cured.

Therefore, as shown in FIG. 26-(E), by removing the portion of the photosensitive resin which has not been cured, the portion of the photosensitive resin corresponding to the seal resin 13B, which has openings in which the external connection terminal parts 17 are exposed, remains on the wafer. Thereafter, as shown in FIG. 26-(F), after providing the solder balls 18 on the external connection terminals 12, the wafer is diced so as to obtain a plurality of semiconductor devices 10A.

Figure 27:
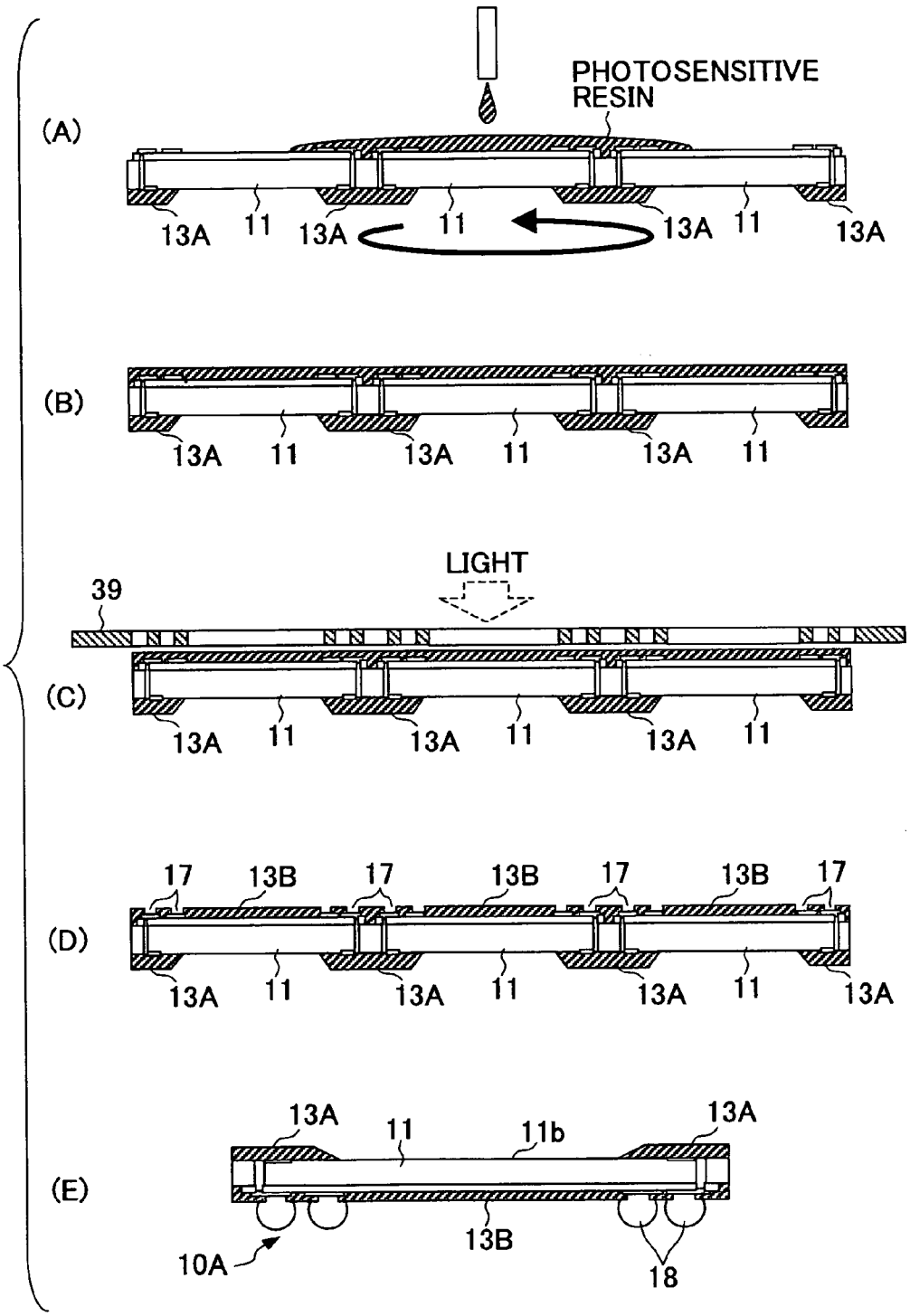
FIG. 27 is an illustration showing a resin-encapsulation process by a spin coating method on the back side of the wafer.

Additionally, the resin-encapsulation may be performed on the back surface side (mounting surface side) by using a spin coating method. FIG. 27 is an illustration showing a process of resin-encapsulation by a spin coating method on the back side of the wafer.

First, by performing the compression molding process shown in FIG. 20, the resin-encapsulation on the front side (sensor surface side) of the wafer is performed so as to form the seal resin 13A. Then, as shown in FIG. 27-(A), a liquid photosensitive resin is applied onto the mounting surface of the wafer while rotating the wafer so as to spread uniformly the photosensitive resin on the entire back surface of the wafer.

Subsequently, as shown in FIG. 27-(C), the photosensitive resin is exposed to a light through the patterning mask 39 is patterned so that a light can be irradiated onto the portion where the seal resin 13B of each of the semiconductor elements 11 is provided. Accordingly, the photosensitive resin corresponding to the portion where the external connection terminal parts 17 are exposed is not cured, and only the portion other than that is cured.

Thus, by removing the photosensitive resin that has not been cured, the seal resin 13B having opening remains on the wafer in a state where the external connection terminal parts 17 are exposed in the openings. Thereafter, as shown in FIG. 25-(E), the solder balls 18 are provided to the external connection terminal parts 17 and the wafer is diced so as to obtain a plurality of semiconductor devices 10A.

Here, in the compression molding shown in FIG. 20, although the seal resin is prevented from flowing onto the sensor surfaces 11b by pressing the protruding portions 30a to the sensor surfaces 11b through the sheet material 31, a slight amount of the seal resin may enter between the sheet material 31 and the sensor surfaces 11b due to a magnitude of the pressing force or fluctuation in the molding condition. As a result, a resin burr (thin film of the resin) 13As may be formed on the sensor surface 11b s shown in FIG. 28-(A).

Figure 28:
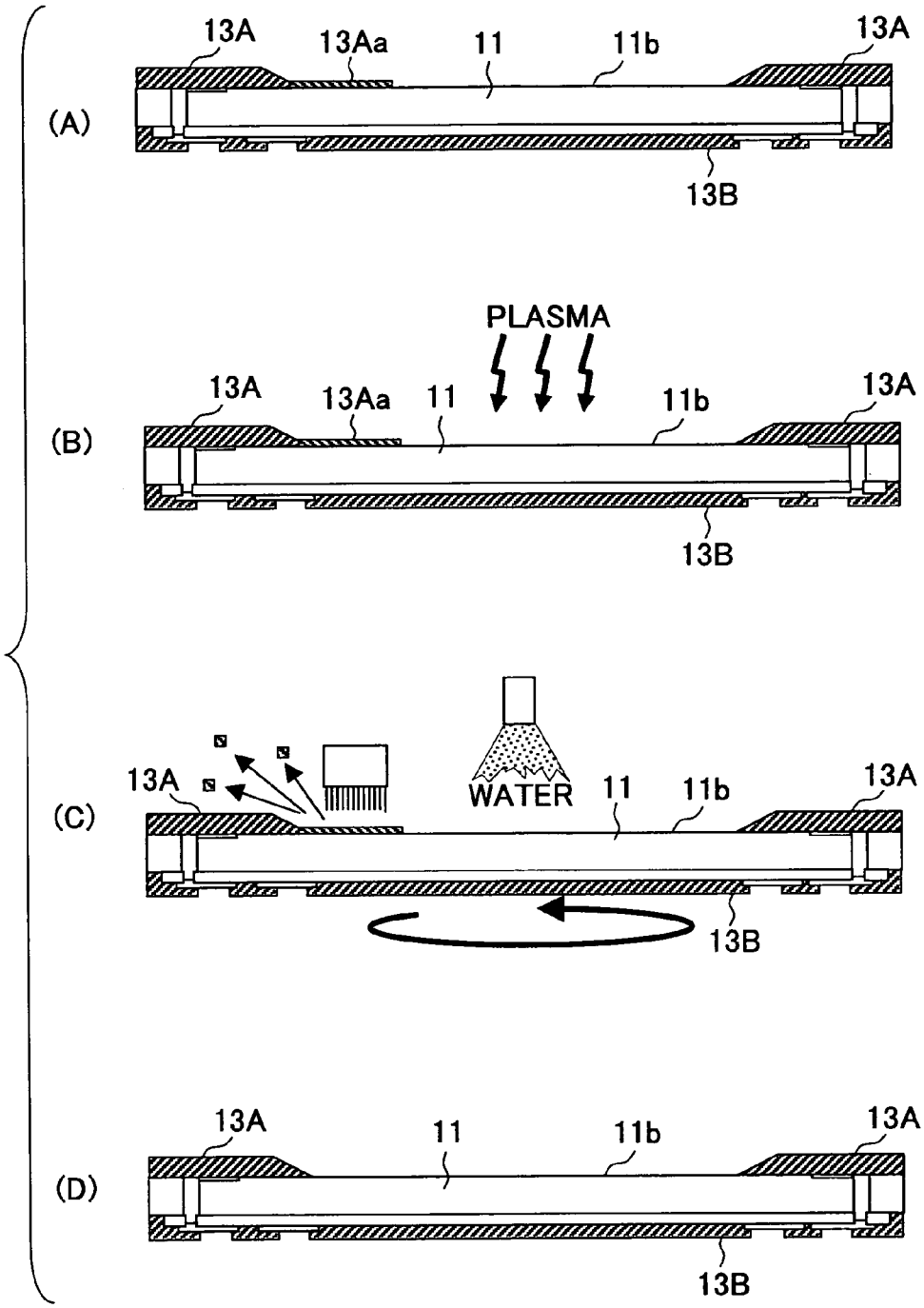
FIG. 28 is an illustration showing a process of removing a resin burr on a sensor surface.

Thus, in order to remove the resin burr 13Aa, an ashing process is performed by irradiating plasma onto the sensor surface side of the wafer as shown in FIG. 28-(B). According to the ashing process, the resin burr 13Aa becomes brittle due to rarefaction, and adhesion to the sensor surfaces 11b is weakened. Thus, the resin burr 13Aa can be removed easily.

That is, as shown in FIG. 28-(C), the resin burr 13Aa subjected to the ashing process is removed by a scrub process (brushing and water cleaning treatment while rotating the wafer) so as to positively expose the sensor surfaces 11 as shown in FIG. 28-(D).

It should be noted that is there is a possibility that resin burrs are formed on the external connection terminals or the external connection terminal parts 17 on the mounting surface side, those parts may be subjected to the above-mentioned ashing process so as to remove the resin burrs. Although FIG. 28 shows a process of removing the resin burr 13Aa on one semiconductor device, it is preferable to perform the removal of the resin burr in a wafer state.

A description will now be given of a recognition mark used for position detection when cutting the wafer by dicing.

Figure 29:
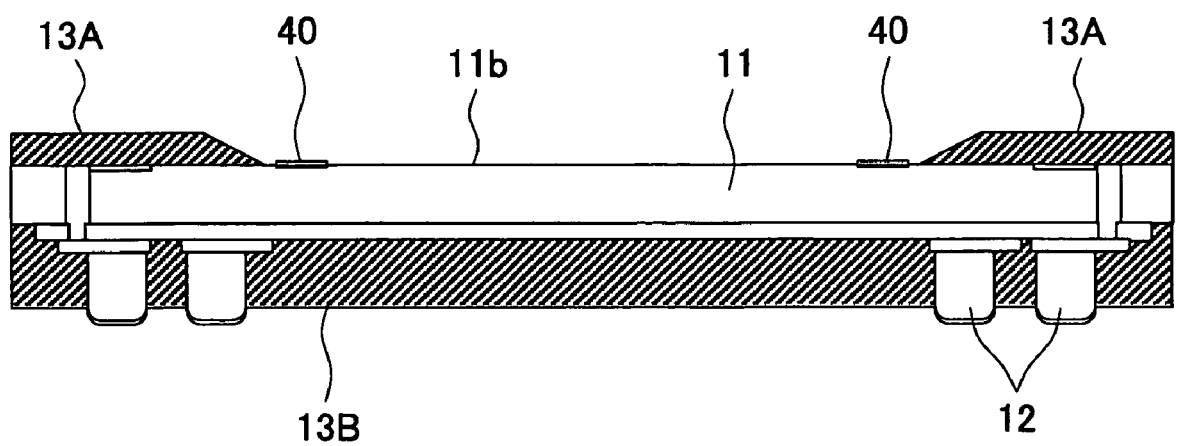
FIG. 29 is a cross-sectional view of a semiconductor device for fingerprint sensors having a sensor surface provided with recognition marks.
Figure 30:
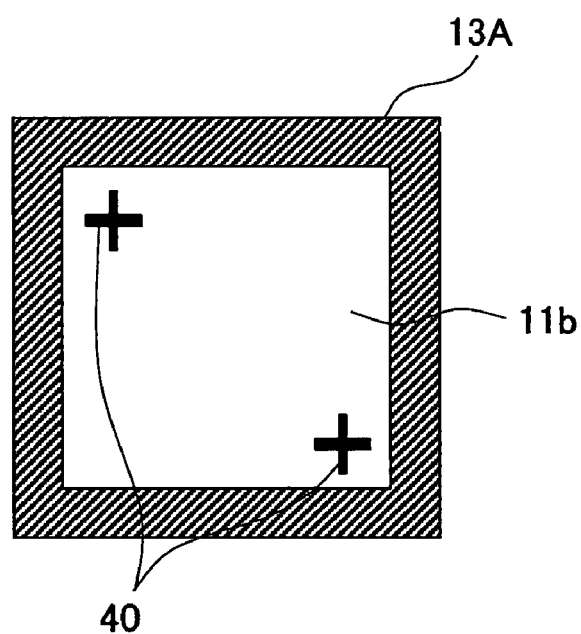
FIG. 30 is a plan view of the sensor surface shown in FIG. 29.

FIG. 29 is a cross-sectional view of the semiconductor device 10 having a sensor surface provided with recognition marks. FIG. 30 is a plan view of the sensor surface shown in FIG. 29. In the semiconductor device 10 for fingerprint sensors according to the above-mentioned embodiment, recognition marks (index marks) 40 are provided in the sensor surface 11b exposed from the seal resin 13A. The recognition marks 40 are formed as a dummy pattern in the process of forming wiring on the circuit formation surface of the semiconductor element 11. If the wiring is, for example, aluminum wiring, the recognition marks 40 are also made of aluminum.

Since the recognition marks 40 are provided on the sensor surface 11b that is exposed from the seal resin 13A, the recognition marks 40 can be used for determining a cutting position when cutting the wafer by dicing in a final process by placing the sensor 11b facing upward. That is, the dicing can be performed by determining the boundaries of the semiconductor elements 11 while recognizing the recognition marks 40 provided on the sensor surface 11b.

As mentioned above, the dicing can be performed with higher accuracy by providing the recognition marks 40 on the sensor surface than in a case where an outer shape of the sensor surface is recognized as a recognition mark when dicing, such as performed normally. This is because, the outer shape of the sensor surface is defined by the seal resin, and the accuracy is determined by a positioning between the wafer and the mold die, which may cause a position error of the wafer itself.

Figure 31:
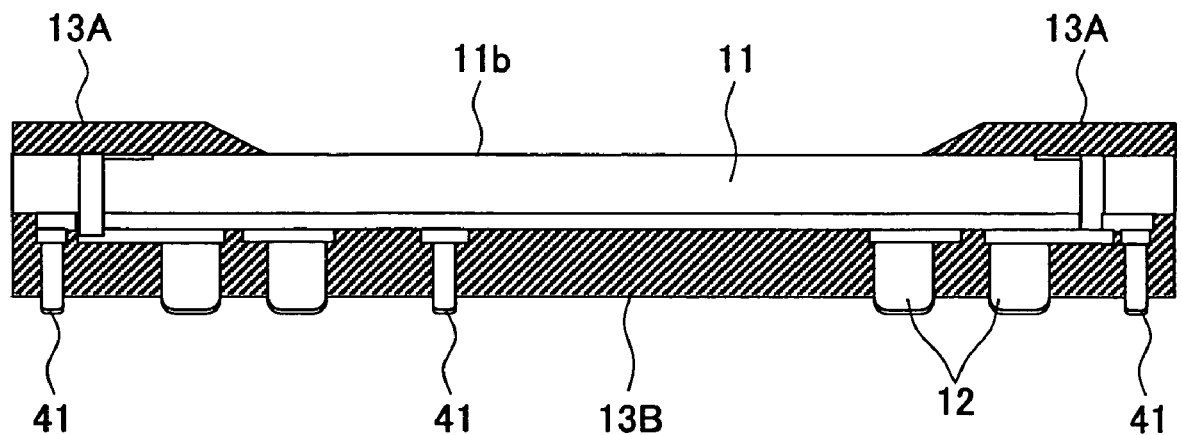
FIG. 31 is a cross-sectional view of a semiconductor device for fingerprint sensors provided with recognition marks on the mounting surface side.
Figure 32:
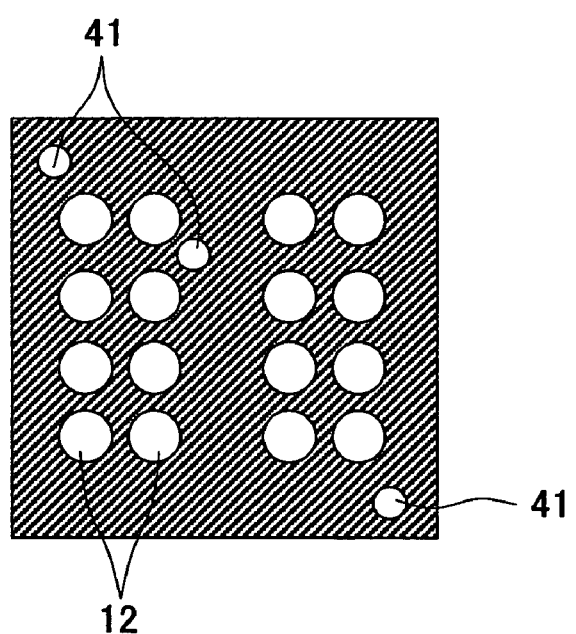
FIG. 32 is a plan view of the mounting surface shown in FIG. 31.

FIG. 31 is a cross-sectional view of the semiconductor device 10 having a mounting surface provided with recognition marks. FIG. 32 is a plan view of the mounting surface shown in FIG. 31.

In the semiconductor device 10 for fingerprint sensors according to the above-mentioned embodiment, the recognition marks 41 are provided on the mounting surface side. Similar to the external connection terminals 12 and the external connection terminal parts 17, the recognition marks 41 are formed using a wire-rearranging technique. The recognition marks 41 are also exposed from the seal resin 13B.

Since the recognition marks 41 are provided so as to be exposed from the seal resin 13B, the recognition marks 41 are uses for determining a cutting position, when cutting the wafer by dicing in a final process, by cutting the wafer with the mounting surface facing upward. That is, the dicing lines can be determined by recognizing the recognition marks 41 exposed on the mounting surface As mentioned above, by providing the recognition marks 41 on the mounting surface, dicing can be performed with higher accuracy than a case where the solder balls provided on the external connection terminals are recognized as is performed usually. The solder balls are joined by melting solder, and there is dispersion in the size and outer shape of the solder balls. Thus, such an inaccuracy of mounting accuracy of the solder balls may give an influence to the cutting positions.

Here, the recognition marks 40 shown in FIG. 29 and FIG. 30 are not only used in the process of individualizing the semiconductor devices but also used in the process of forming the V-groove for forming the slanting surfaces shown in FIG. 13. FIG. 32 is an illustration for explaining that the same recognition marks are used in both the V-groove forming process and the dicing process.

First, as shown in drawing 33-(A), the position of forming the V-groove is determined by image-recognizing the recognition marks 40 provided on the sensor surfaces 11b on the wafer. Then, as shown in FIG. 33-(B), a half-cut is carried out using a V-shaped dicing blade (refer to FIG. 13 for the half-cut).

Figure 33:
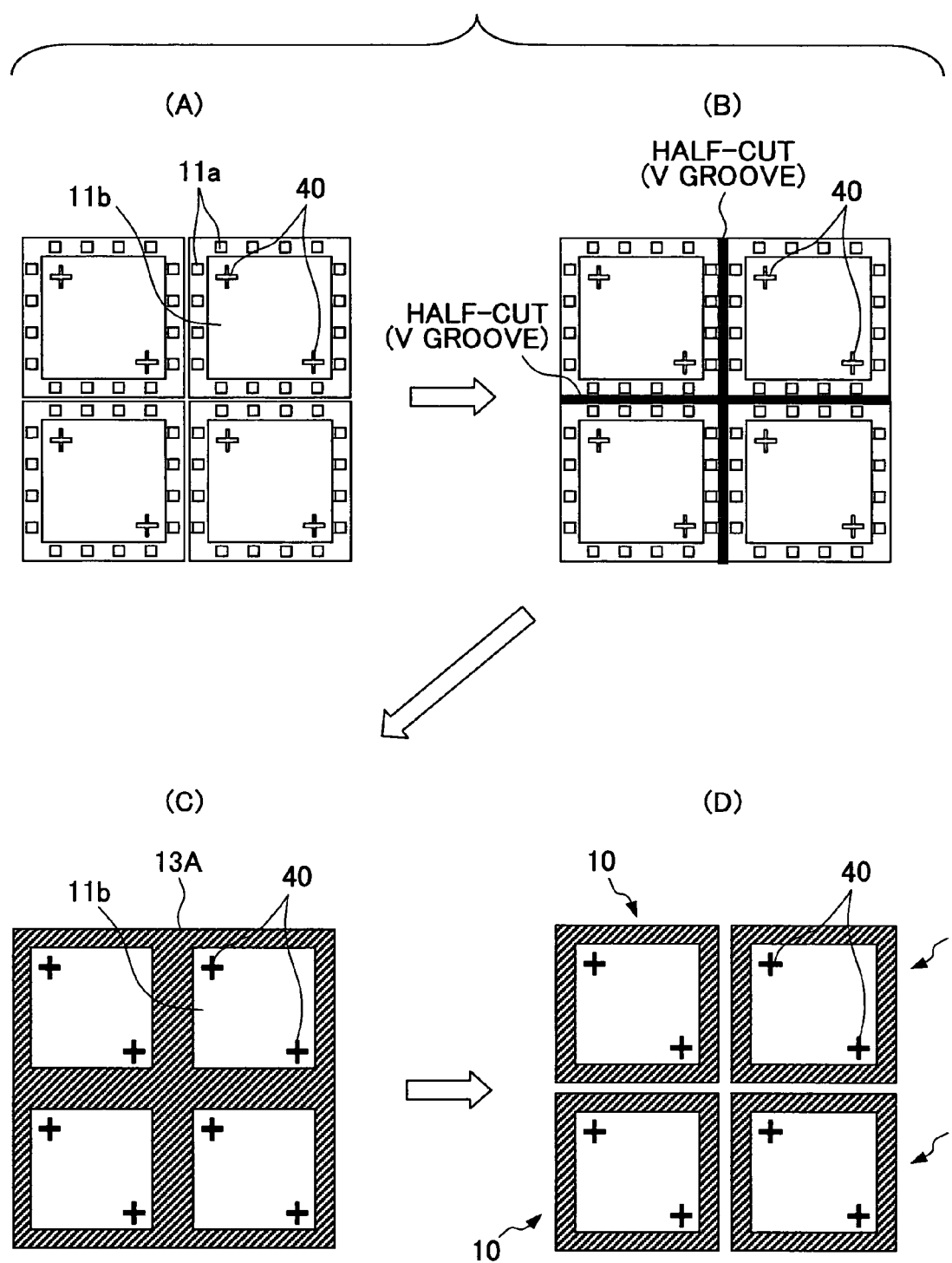
FIG. 33 is an illustration for explaining that the same recognition marks are used in both a V-groove forming process and a dicing process.

Then, after forming the seal resin 13A, a dicing line is determined on the wafer by image-recognizing the recognition marks 40 provided on the sensor surfaces 11b again, and the semiconductor devices 10 are individualized by dicing along the determined dicing line as shown in FIG. 33-(D).

According to the above-mentioned method, the position of the half-cut (position of the V-groove) and the position of the dicing accurately match with each other since the recognition of the dicing line when performing the half-cut and the recognition of the dicing line when dicing are carried out using the same recognition marks 40. Accordingly, the slanting surface 11c of the semiconductor element 11 shown in FIG. 12 can be accurately formed, and the sides of the semiconductor element 11 can be surely encapsulated by resin.

The above-mentioned method using the same recognition marks for recognition of a dicing line when performing the half-cut and when dicing an also be used in the case where the recognition marks 41 are formed on the mounting surface of the wafer. That is, the position of forming the V-groove (that is, a dicing line corresponding to boundaries of the semiconductor elements) is determined by image-recognizing the recognition marks 41 provided on the wiring 14 of the wafer, and the V-groove is formed by half-cut using a V-shaped dicing blade (refer to FIG. 13 for the half-cut). After forming the seal resin 13B, the recognition marks 41 exposed from the seal resin 13B are image-recognized again in the individualization process, and the semiconductor devices 10 are individualized by dicing the wafer along the recognized dicing line.

The present invention is not limited to the specifically disclosed embodiments, and variations and modifications may be made without departing from the scope of the present invention.

The present application is based on Japanese priority application No. 2005-093001 filed Mar. 28, 2005, the entire contents of which are hereby incorporated herein by reference.

What is claimed is:

1. A semiconductor device having a functional surface that provides a predetermined function, the semiconductor device comprising:
    a semiconductor element having a circuit formation surface on which a plurality of electrodes are formed and a back surface opposite to the circuit formation surface, a part of the circuit formation surface functioning as said functional surface;
    a first resin provided on the circuit formation surface of said semiconductor element and exposing said functional surface from the semiconductor device;
    wiring formed on said back surface of the semiconductor element;
    a plurality of connection parts extending between said circuit formation surface and said back surface of said semiconductor element so as to electrically connect the electrodes to said wiring;
    a second resin formed on said back surface of said semiconductor element so as to cover said wiring; and
    a plurality of external connection terminals protruding from a surface of said second resin on a side of said back surface of said semiconductor element, wherein a side surface of said semiconductor element includes a first slanting surface that is slanted with respect to said circuit formation surface, the first slanting surface covered by said first resin and the side surface of said semiconductor element includes a second slanting surface that is slanted with respect to said back surface, the second slanting surface covered by said second resin, and the side surface of said semiconductor element includes an uncovered middle surface between the first and second slanting surfaces.

2. The semiconductor device as claimed in claim 1, wherein each of said external connection terminals is provided with one of a solder ball and a solder coat.

3. The semiconductor device as claimed in claim 1, wherein said wiring is encapsulated by seal resin, and said external connection terminals are exposed in respective openings provided in the seal resin.

4. The semiconductor device as claimed in claim 3, wherein each of said external connection terminals is provided with one of a solder ball, a solder coat and a protruding terminal having an area smaller than each of said external connection terminal.

5. The semiconductor device as claimed in claim 3, wherein said circuit formation surface of said semiconductor element is encapsulated by seal resin so that said functional surface is exposed, and the seal resin covers at least a part of a side surface of said semiconductor element.

6. The semiconductor device as claimed in claim 5, wherein a side surface of said semiconductor element includes a slanting surface that is slanted with respect to a surface perpendicular to said circuit formation surface, and the slanting surface is covered by said seal resin.

7. The semiconductor device as claimed in claim 1, wherein said wiring formed on said back surface of said semiconductor element is encapsulated by seal resin so that said external connection terminals are exposed, and the seal resin covers at least a part of a side surface of said semiconductor element.

8. The semiconductor device as claimed in claim 7, wherein a side surface of said semiconductor element includes a slanting surface that is slanted with respect to a surface perpendicular to said back surface, and the slanting surface is covered by said seal resin.

9. The semiconductor device as claimed in claim 1, wherein said circuit formation surface of said semiconductor element is encapsulated by a first seal resin so that said functional surface is exposed; said wiring formed on said back surface of said semiconductor element is encapsulated by a second seal resin so that said electrical connection terminals are exposed; and said first seal resin and said second seal resin have different characteristics from each other.

10. The semiconductor device as claimed in claim 1, wherein a recognition mark formed of the same material as the wiring formed on said circuit formation surface of said semiconductor element is formed on said functional surface.

11. The semiconductor device as claimed in claim 1, wherein said functional surface of said semiconductor element is a sensor surface for detecting fingerprint.

* * * * *